US011636903B2

(12) United States Patent
Ngo

(10) Patent No.: US 11,636,903 B2
(45) Date of Patent: Apr. 25, 2023

(54) SEMICONDUCTOR CIRCUIT, RECEIVING DEVICE, AND MEMORY SYSTEM

(71) Applicant: Kioxia Corporation, Tokyo (JP)

(72) Inventor: Huy Cu Ngo, Isehara (JP)

(73) Assignee: Kioxia Corporation, Tokyo (JP)

( * ) Notice: Subject to any disclaimer, the term of this patent is extended or adjusted under 35 U.S.C. 154(b) by 45 days.

(21) Appl. No.: 17/473,269

(22) Filed: Sep. 13, 2021

(65) Prior Publication Data

US 2022/0301639 A1 Sep. 22, 2022

(30) Foreign Application Priority Data

Mar. 22, 2021 (JP) .............................. JP2021-047432

(51) Int. Cl.
| | |
|---|---|
| *H03M 1/06* | (2006.01) |
| *G11C 16/32* | (2006.01) |
| *G06F 1/10* | (2006.01) |
| *G11C 16/28* | (2006.01) |

(52) U.S. Cl.
CPC .............. *G11C 16/32* (2013.01); *G06F 1/10* (2013.01); *G11C 16/28* (2013.01); *H03M 1/0663* (2013.01)

(58) Field of Classification Search
CPC ........... G11C 16/32; G11C 16/28; G06F 1/10; H03M 1/0663; H03M 1/0624; H03M 1/0836; H03M 1/1028; H03M 1/121
See application file for complete search history.

(56) References Cited

U.S. PATENT DOCUMENTS

| | | | |
|---|---|---|---|
| 7,834,786 B2 * | 11/2010 | Kawahito | ........... H03M 1/1009 341/122 |
| 8,587,460 B2 | 11/2013 | Noguchi et al. | |
| 8,659,454 B2 | 2/2014 | Sugimoto et al. | |
| 8,830,094 B1 | 9/2014 | Erdmann | |
| 9,337,853 B2 | 5/2016 | Nakamura et al. | |
| 9,444,480 B1 | 9/2016 | Zanchi et al. | |
| 9,543,976 B2 | 1/2017 | Miki et al. | |

(Continued)

FOREIGN PATENT DOCUMENTS

| | | | |
|---|---|---|---|
| JP | 5288003 B2 | 9/2013 | |
| JP | 5537527 B2 | 7/2014 | |

(Continued)

OTHER PUBLICATIONS

Razavi "Design Considerations for Interleaved ADCs" IEEE Journal of Solid-State Circuits vol. 48, No. 8, Aug. 2013, 12 pages.

(Continued)

*Primary Examiner* — Khamdan N. Alrobaie
(74) *Attorney, Agent, or Firm* — Oblon, McClelland, Maier & Neustadt, L.L.P.

(57) ABSTRACT

According to the one embodiment, a semiconductor circuit includes: an analog-to-digital conversion circuit including a first analog-to-digital converter configured to sample at least one first sampling signal regarding an input signal based on a first clock, and a second analog-to-digital converter configured to sample at least one second sampling signal regarding the input signal based on a second clock shifted from the first clock by a first time; and a first calibration circuit configured to calibrate at least one timing of the first clock and the second clock based on a calculation result of a moving average of the first sampling signal and the second sampling signal.

20 Claims, 19 Drawing Sheets

(56) References Cited

U.S. PATENT DOCUMENTS

| | | | |
|---|---|---|---|
| 9,602,123 B2 | 3/2017 | Sundblad et al. | |
| 9,685,970 B1* | 6/2017 | Lee | H03M 1/1245 |
| 2003/0016150 A1* | 1/2003 | Noll | H03M 1/188 |
| | | | 341/139 |
| 2013/0058437 A1* | 3/2013 | Oshima | H03M 1/0836 |
| | | | 341/166 |
| 2014/0091956 A1* | 4/2014 | Yoshimi | H03M 1/1009 |
| | | | 341/120 |
| 2016/0087643 A1* | 3/2016 | Nozaki | H03M 1/0836 |
| | | | 341/118 |
| 2019/0296759 A1* | 9/2019 | Sugiyama | H03M 1/1215 |
| 2020/0235747 A1* | 7/2020 | Kang | H03M 1/0624 |
| 2021/0359694 A1* | 11/2021 | Chen | H03M 1/0624 |
| 2022/0301639 A1* | 9/2022 | Ngo | G06F 1/10 |

FOREIGN PATENT DOCUMENTS

| | | |
|---|---|---|
| JP | 5836493 B2 | 12/2015 |
| JP | 2017-505045 A | 2/2017 |
| JP | 2017-153075 A | 8/2017 |
| JP | 6722900 B2 | 7/2020 |

OTHER PUBLICATIONS

Wei et al. "An 8-Bit 4-GS/s 120-mW CMOS ADC", IEEE Journal of Solid-State Circuits vol. 49, No. 8, Aug. 2014, 4 pages.

* cited by examiner

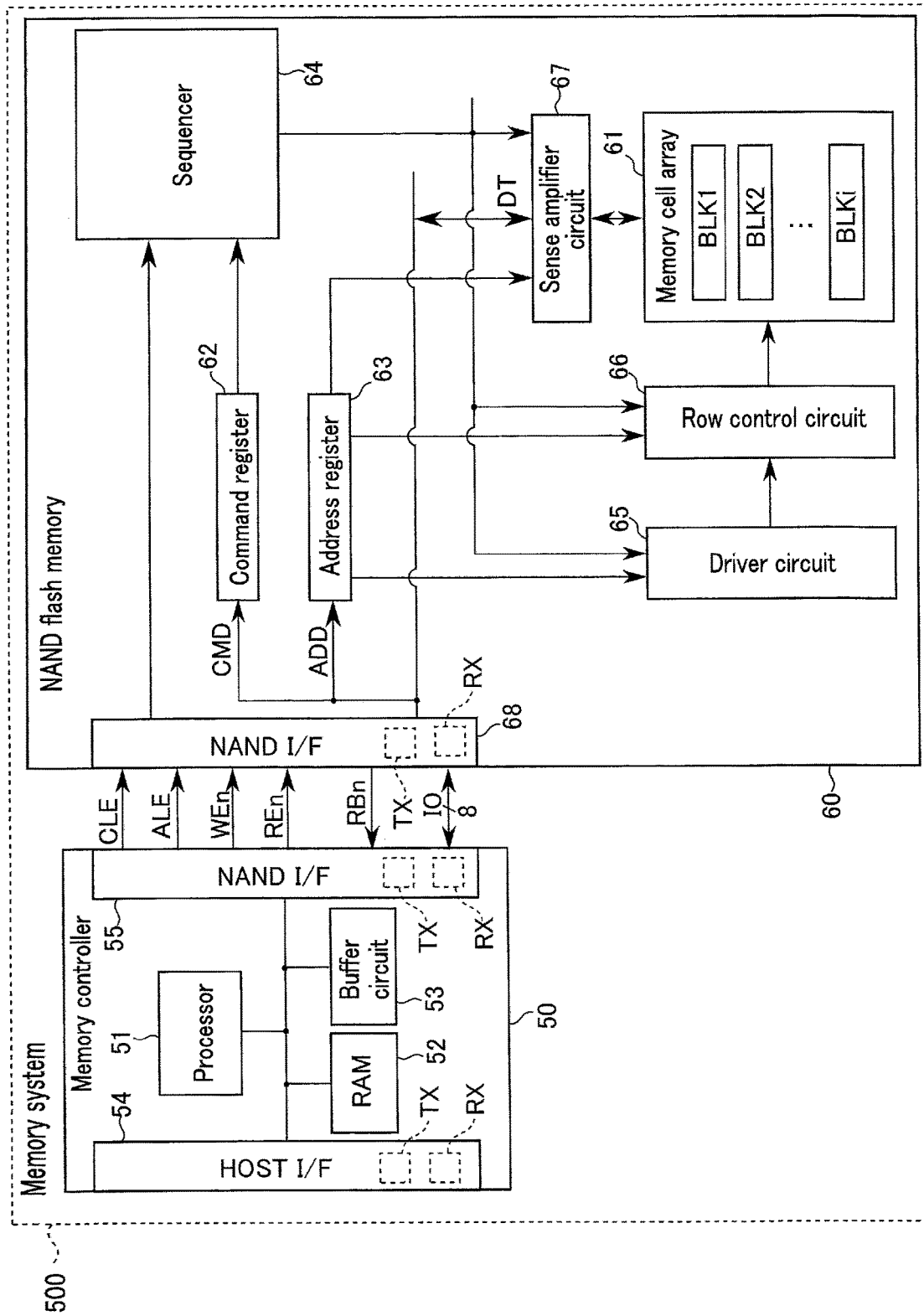
F I G. 2

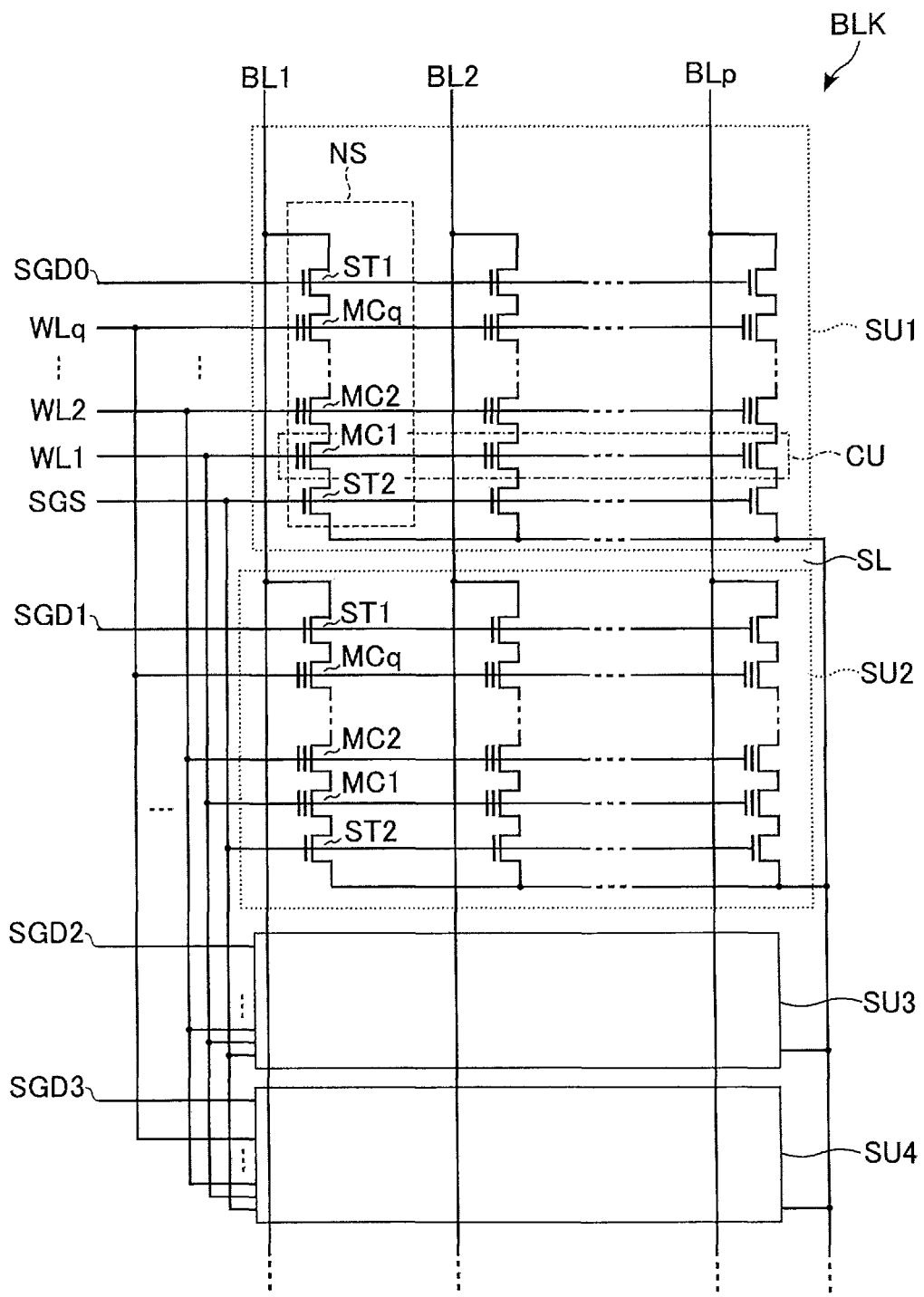
F I G. 3

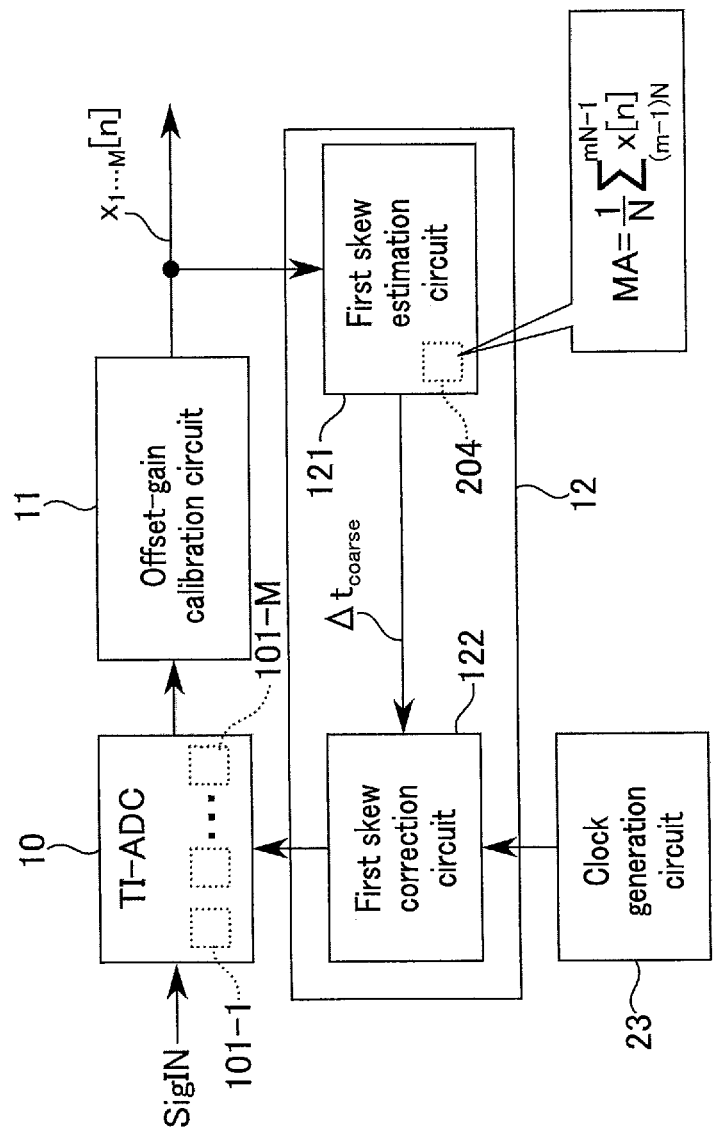
F I G. 6

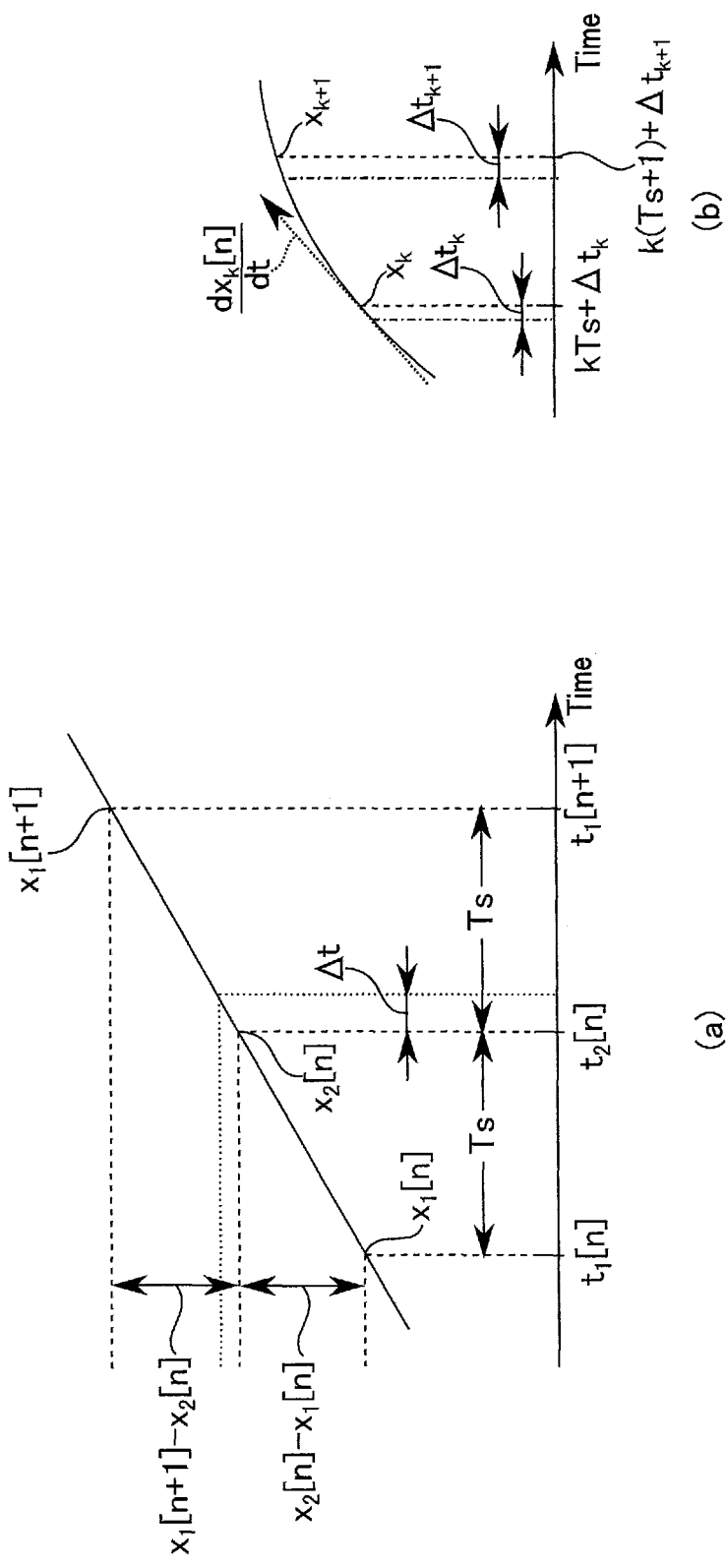
F I G. 9

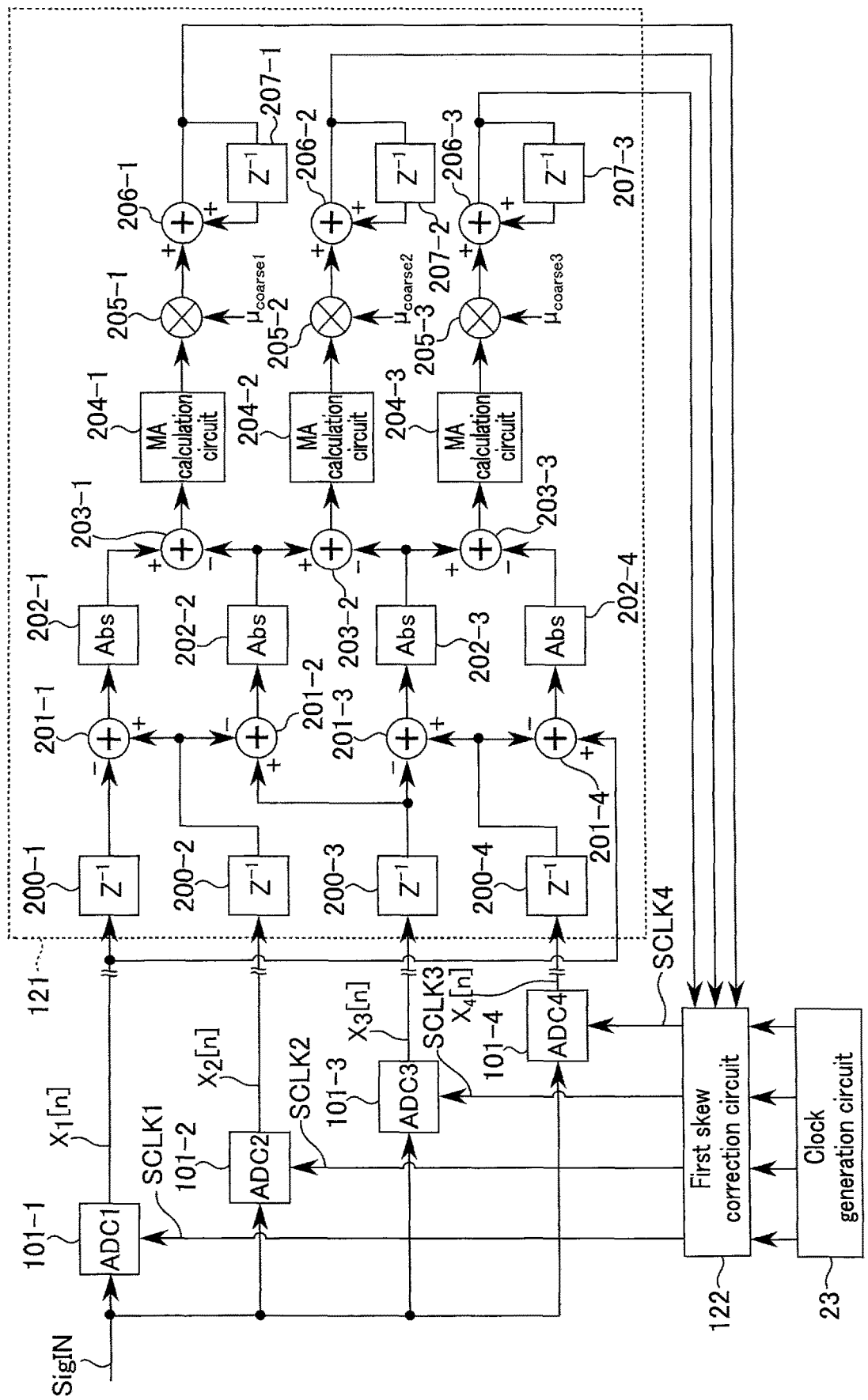
F I G. 10

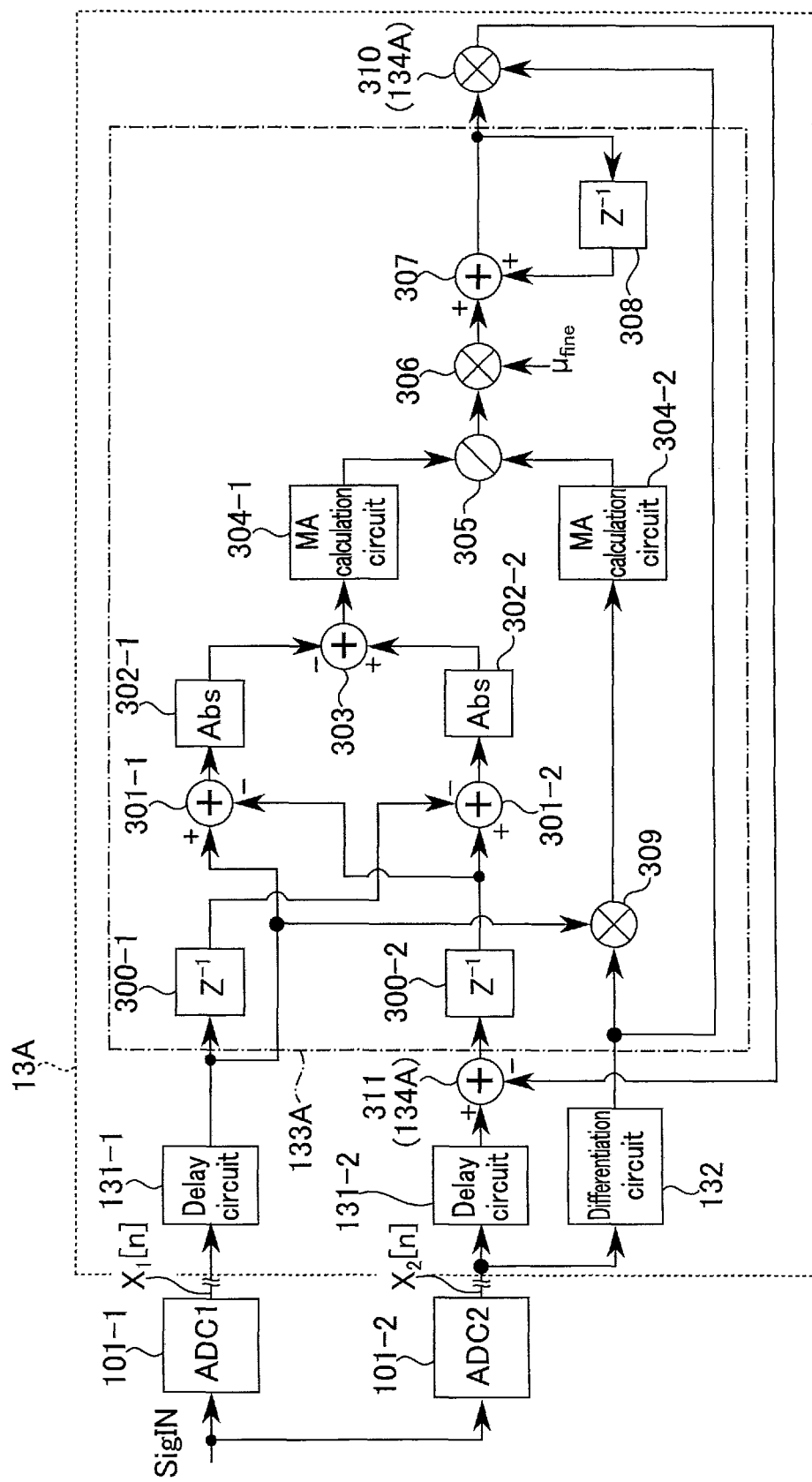
F I G. 15

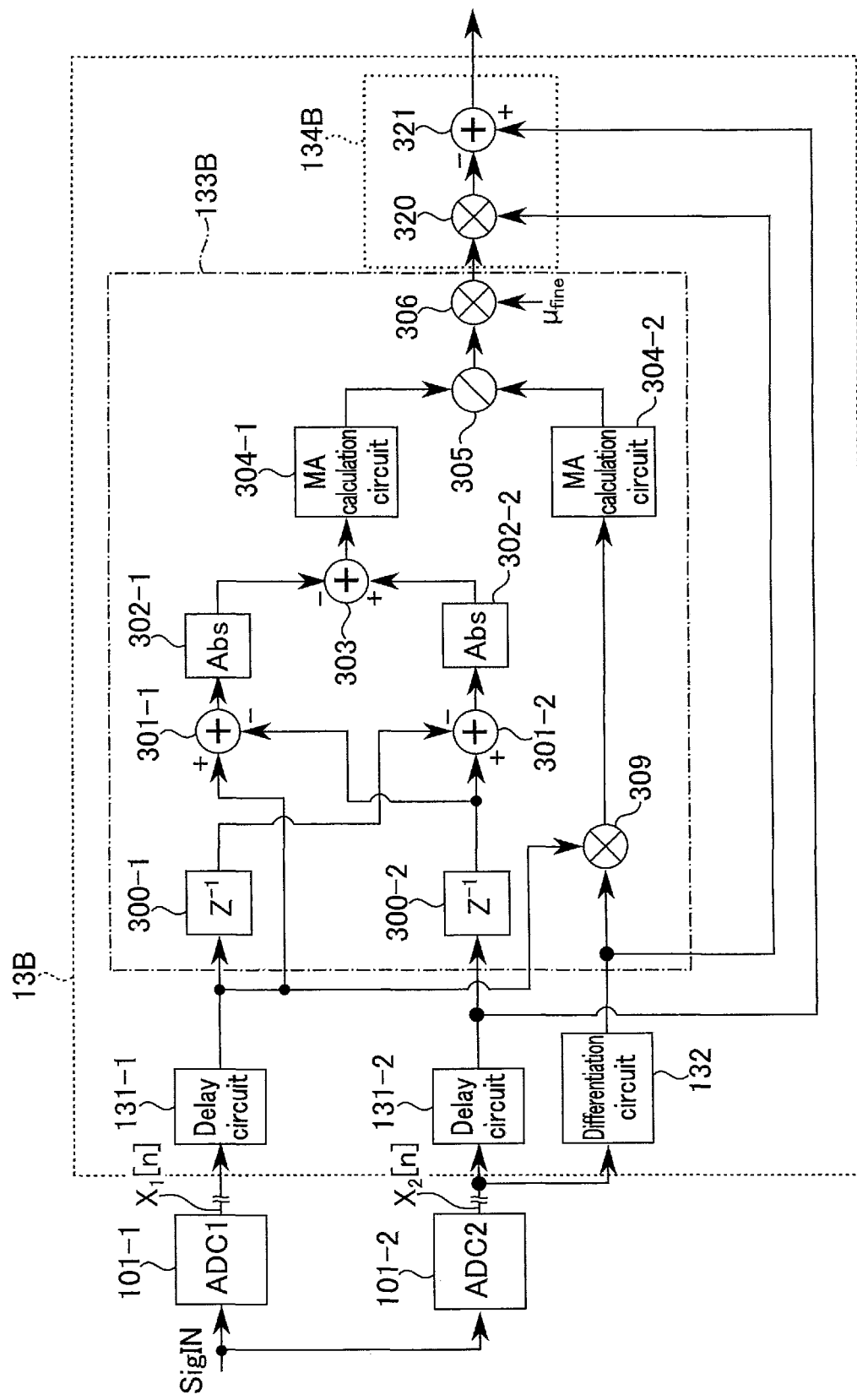
F I G. 17

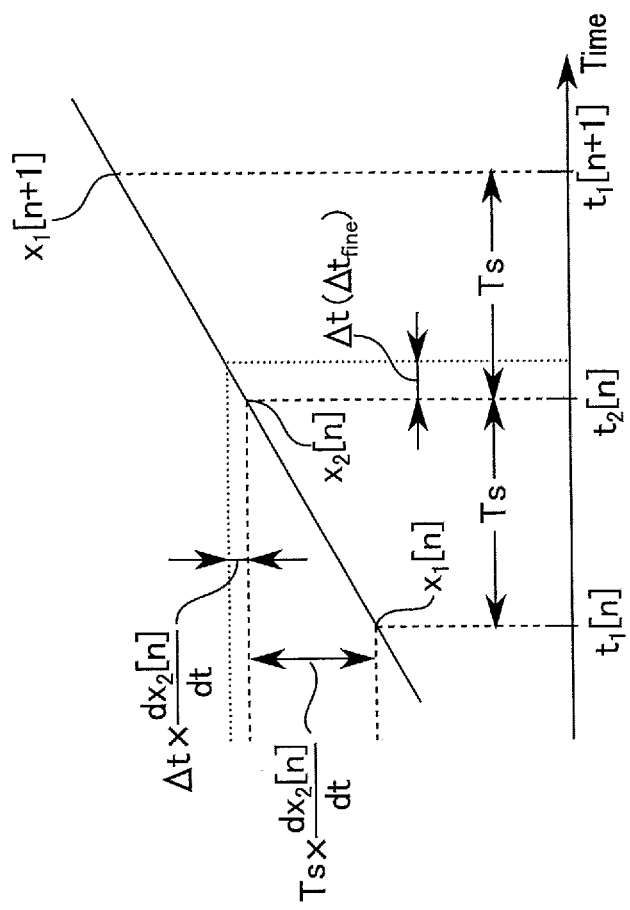
F I G. 18

SEMICONDUCTOR CIRCUIT, RECEIVING DEVICE, AND MEMORY SYSTEM

CROSS-REFERENCE TO RELATED APPLICATIONS

This application is based upon and claims the benefit of priority from Japanese Patent Application No. 2021-047432, filed Mar. 22, 2021, the entire contents of which are incorporated herein by reference.

FIELD

Embodiments described herein relate generally to a semiconductor circuit, receiving device, and a memory system.

BACKGROUND

A research and development of transmitting circuits and receiving circuits for high-speed data transfer have been propelled. Such a semiconductor circuit and a receiving device can be implemented in a memory system.

BRIEF DESCRIPTION OF THE DRAWINGS

FIG. 2 is a block diagram showing an example of a configuration of a memory system;

FIG. 3 is a circuit diagram showing an example of a circuit configuration of a memory cell array;

FIG. 6 is a block diagram for explaining an example of a configuration of a first skew calibration circuit according to the embodiment;

FIG. 9 is a diagram for explaining a concept of the semiconductor circuit according to the embodiment;

FIG. 10 is a circuit diagram showing an example of a configuration of the semiconductor circuit according to the embodiment;

FIGS. 14, 15, 16, and 17 are diagrams each showing an example of a configuration of the semiconductor circuit according to the embodiment;

FIG. 18 is a diagram for explaining a concept of the semiconductor circuit according to the embodiment.

DETAILED DESCRIPTION

Figure 1:
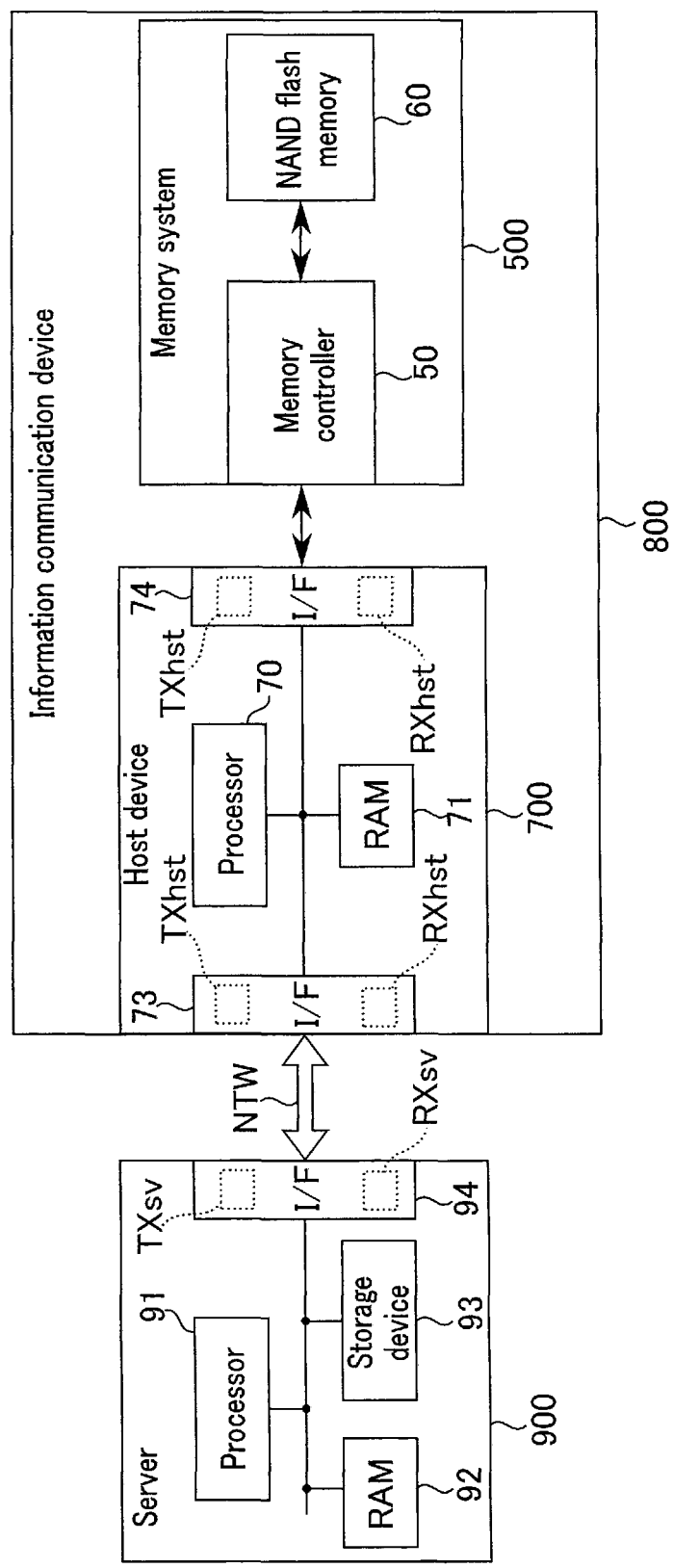
FIG. 1 is a block diagram for explaining an apparatus including a semiconductor circuit according to an embodiment.

An embodiment will now be described in detail with reference to the accompanying drawings. In the following description, the same reference numerals denote elements having the same functions and configurations.

In the following embodiment, when constituent elements (for example, circuits, interconnections, and various voltages and signals) having reference numerals with numerals/alphabetical letters at the end for distinction need not be distinguished from each other, descriptions (reference numerals) from which numerals/alphabetical letters at the end are omitted are used.

In general, according to one embodiment, a semiconductor circuit includes: an analog-to-digital conversion circuit including a first analog-to-digital converter configured to sample at least one first sampling signal regarding an input signal based on a first clock, and a second analog-to-digital converter configured to sample at least one second sampling signal regarding the input signal based on a second clock shifted from the first clock by a first time; and a first calibration circuit configured to calibrate at least one timing of the first clock and the second clock based on a calculation result of a moving average of the first sampling signal and the second sampling signal.

Embodiment

A semiconductor circuit, a receiving device, a memory system, and a semiconductor circuit control method according to an embodiment will be described with reference to FIGS. 1, 2, 3, 4, 5, 6, 7, 8, 9, 10, 11, 12, 13, 14, 15, 16, 17, 18 and 19.

(a) Overall Configuration

FIG. 1 is a block diagram for explaining an apparatus including the semiconductor circuit according to the embodiment.

As shown in FIG. 1, a server 900 is connectable to an information communication device 800 via a network NTW. FIG. 1 depicts a state of the server 900 being connected to the information communication device 800. The server 900 can transmit various data to the information communication device 800. The server 900 can receive data from the information communication device 800.

The server 900 includes a processor 91, a RAM 92, a storage device 93, and an interface circuit 94.

The processor 91 performs various processes (calculation processing and data processing) and control in the server 900. The processor 91 can create a file including various data and/or information.

The RAM 92 functions as a work area for various data processes in the server 900. The RAM 92 temporarily stores programs (an example of software), and data (for example, results of calculation processing, data during calculation processing, and/or parameters) used in various processes by the processor 91.

The storage device 93 stores various programs and various pieces of information.

The interface circuit 94 communicates with another device (here, the information communication device 800) based on a given interface standard and/or communication protocol used in the network NTW.

The interface circuit 94 includes a transmitting circuit TXsv for data transmission. The interface circuit 94 includes a receiving circuit RXsv for data reception.

The information communication device 800 includes a memory system 500 according to the embodiment, and a host device 700.

In the information communication device 800, the memory system 500 according to the embodiment performs data write, data read, and data erase within the memory system 500 based on a request from the host device 700.

The internal configuration of the memory system 500 according to the embodiment will be described later.

The host device 700 includes a processor 70, a RAM 71, and interface circuits 73 and 74.

The processor (to be also referred to as a host processor) 70 controls various processes and operations of the host device 700.

The host processor 70 can issue (generate and transfer) commands (to be referred to as host commands) for requesting (ordering and instructing) various processes and operations of the memory system 500. The host processor 70 can generate data complying with a host command. The data includes, for example, information (for example, address information) used in processes and operations by the memory system 500, parameters, and data to be written into the memory system 500.

The RAM 71 functions as the work area (work memory) for various data processes by the host processor 70. The RAM 71 temporarily stores programs (an example of software), and data (for example, results of calculation processing, data during calculation processing, and parameters) used in various processes by the host processor 70.

The interface circuit 73 communicates with the server 900 via the network NTW based on the given interface standard and/or communication protocol. The interface circuit 73 outputs signals, data, and the like from the server 900 to an internal bus in the host device 700.

The interface circuit 74 communicates with the memory system 500 based on a given interface standard and/or communication protocol. Each of the interface circuits 73 and 74 includes a transmitting circuit TXhst for data transmission, and a receiving circuit RXhst for data reception.

Note that a host command to the memory system 500 is based on the interface standard of the interface circuit 74. For example, the interface standard (or communication protocol) used in the interface circuit 74 is selected from the SAS standard, SATA standard, PCIexpress™ standard (to be referred to as the PCIe standard), NVMexpress™ standard (to be referred to as the NVMe standard), UFS (Universal Flash Storage) standard, and the like. Note that an interface standard complying with one of these standards or another interface standard may be used for the interface circuit 74.

In addition to the above-described configuration, the host device 700 may further include a buffer circuit and a storage device such as an HDD (Hard Disc Drive) (neither is shown).

For example, the host device 700 (or the information communication device 800) is a personal computer, a smartphone, a feature phone, a mobile terminal (for example, a tablet terminal), a game device, an in-vehicle terminal, a router, a base station, or the like.

Memory System

FIG. 2 is a block diagram for explaining an example of the configuration of the memory system according to the embodiment.

The memory system 500 according to the embodiment includes a memory controller 50 and a NAND flash memory (to be also simply referred to as a flash memory) 60.

(Memory Controller)

The memory controller 50 instructs (orders) the NAND flash memory 60 to perform various processes and operations such as data write, data read, and data erase with respect to the flash memory 60 based on the request from the host device 700.

The memory controller 50 includes a processor 51, a RAM 52, a buffer circuit 53, and interface circuits 54 and 55.

The processor 51 can instruct (order) the NAND flash memory 60 to perform various processes or operations. For example, the processor can generate a command (to be also referred to as a controller command) representing an instruction to the NAND flash memory 60.

The RAM 52 functions as the work area for various processes and operations of the processor 51 in the memory controller 50. The RAM 52 temporarily stores programs, and data (results of calculation processing, data during calculation processing, and parameters) and the like used in various processes by the processor 51.

Note that the RAM 52 may be a memory area provided in the processor 51.

The buffer circuit 53 temporarily stores data to be transferred between the memory controller 50 and the host device 700, and data to be transferred between the memory controller 50 and the flash memory 60.

The interface circuit (to be also referred to as a host interface circuit) 54 performs data transfer between the host device 700 and the memory controller 50 based on a given interface standard. The interface standard (and communication protocol) of the interface circuit 54 is the same standard (or a compliant standard) as the interface standard of the interface circuit 74 of the host device 700.

The interface circuit (to be also referred to as a NAND interface circuit) 55 performs communication (for example, data transfer) between the memory controller 50 and the NAND flash memory 60 based on the NAND interface standard.

When the memory controller 50 orders the NAND flash memory 60 to perform a given operation, the memory controller 50 transmits a data group (to be also referred to as a NAND command set) including commands and address information to the NAND flash memory 60. When the memory controller 50 orders the NAND flash memory 60 to write data, the NAND command set further includes write data.

In addition to the above-described configuration, the memory controller 50 may include another configuration such as an ECC circuit (not shown) for detecting and correcting error in data.

(NAND Flash Memory)

The NAND flash memory 60 is a nonvolatile semiconductor memory device. The NAND flash memory 60 can store data in substantially a nonvolatile manner.

In the following description, the NAND flash memory 60 will also be simply called the flash memory 60.

The flash memory 60 includes, for example, a memory cell array 61, a command register 62, an address register 63, a sequencer 64, a driver circuit 65, a row control circuit 66, a sense amplifier circuit 67, an interface circuit (input/output circuit) 68, and the like.

The memory cell array 61 stores data. A plurality of bit lines (not shown) and a plurality of word lines (not shown) are provided in the memory cell array 61. The memory cell array 61 includes one or more blocks BLK1 to BLKi (i is an integer of 1 or more). The blocks BLK (BLK1 to BLKi) are sets of memory cells. Each block BLK is used as, for example, the unit of erase of data.

FIG. 3 is an equivalent circuit diagram showing an example of the circuit configuration of the memory cell array 61 of the NAND flash memory 60. FIG. 3 shows one block BLK extracted from the plurality of blocks BLK included in the memory cell array 61.

As shown in FIG. 3, the block BLK includes, for example, four string units SU0, SU1, SU2, and SU3. Each string unit SU includes a plurality of memory cell strings (to be referred to as NAND strings) NS. Each of the NAND strings NS is associated with a corresponding one of bit lines BL1 to BLp (p is an integer of 1 or more).

The NAND string NS includes a plurality of memory cells MC1 to MCq (q is an integer of 1 or more), and select transistors ST1 and ST2.

The memory cells (to be also referred to as memory cell transistors) MC (MC1 to MCq) are field effect transistors each including a charge storage layer. Each memory cell MC can store data of 1 bit or more in substantially a nonvolatile manner.

Each of the select transistors ST1 and ST2 is used to select the string unit SU at the time of various operations.

In each NAND string NS, the memory cells MC1 to MCq are series-connected between a source of the select transistor ST1 and a drain of the select transistor ST2. Each of control gates of the memory cells MC1 to MCq in the same block BLK are commonly connected to a corresponding one of word lines WL1 to WLq.

In each NAND string NS, one end (source) of the select transistor ST1 is connected to one end of the series-connected memory cell MC, and the other end (drain) of the select transistor ST1 is connected to the corresponding bit line BL. A gate of the select transistor ST1 is connected to a corresponding one of select gate lines SGD.

In each NAND string NS, one end (source) of the select transistor ST2 is connected to a source line SL, and the other end (drain) of the select transistor ST2 is connected to the other end of the series-connected memory cell MC. A gate of the select transistor ST2 is connected to a select gate line SGS. For example, the sources of the select transistors ST2 in the same block BLK are commonly connected to one source line SL. The gates of the select transistors ST2 in the same block BLK are commonly connected to one select gate line SGS.

A unit of the memory cells MC connected to a common word line WL in one string unit SU is called, for example, a cell unit CU. For example, when each memory cell MC stores 1-bit data, one cell unit CU can store 1-page data. When each memory cell MC stores 2-bit data, one cell unit CU can store 2-page data. "One-page data" is defined by, for example, a total amount of data stored in the cell unit CU formed from the memory cells MC each storing 1-bit data.

Note that a circuit configuration of the memory cell array 61 of the NAND flash memory 60 according to the embodiment is not limited to the above-described configuration. For example, the number of memory cells MC, that of select transistors ST1, and that of select transistors ST2 in each NAND string NS can be designed to arbitrary numbers, respectively. The number of string units SU in each block ELK can be designed to an arbitrary number.

Referring back to FIG. 2, a configuration except the memory cell array 61 in the flash memory 60 will be explained.

The command register 62 stores a command (controller command) CMD from the memory controller 50. The controller command CMD is a signal set for causing, for example, the sequencer 64 to execute a read operation, a write operation, an erase operation, and the like.

The address register 63 stores address information (to be also referred to as a select address) ADD from the memory controller 50. The address information ADD includes, for example, a block address, a page address (word line address), and a column address. For example, the block address, the page address, and the column address are used to select the block BLK, the word line WL, and the bit line BL, respectively. In the following description, a block selected based on the block address will be called a selected block. A word line selected based on the page address will be called a selected word line.

The sequencer 64 controls operation of internal circuits of the flash memory 60. For example, the sequencer 64 controls the driver circuit 65 based on the controller command CMD in the command register 62.

The driver circuit 65 outputs a plurality of voltages used in data read (read operation), data write (write operation), data erase (erase operation), and the like. For example, the driver circuit 65 applies a voltage to an interconnect corresponding to the selected word line based on the page address in the address register 63.

The row control circuit 66 controls an operation regarding the row of the memory cell array 61. The row control circuit 66 selects one block BLK in the memory cell array 61 based on the block address in the address register 63. The row control circuit 66 transfers, for example, to the selected word line in the selected block BLK, a voltage applied to an interconnect corresponding to the selected word line.

The sense amplifier circuit 67 controls an operation regarding the column of the memory cell array 61. In the write operation, the sense amplifier circuit 67 applies a voltage to respective bit lines provided in the memory cell array 61 in accordance with write data DT from the memory controller 50. In the read operation, the sense amplifier circuit 67 determines data stored in the memory cell based on the potential of the bit line (or generation/non-generation of a current). The sense amplifier circuit 67 transfers data based on the determination result as read data DT to the memory controller 50.

The interface circuit 68 performs input and output of various control signals and data between the memory controller 50 and the flash memory 60.

Communication between the NAND flash memory 60 and the memory controller 50 is supported by the NAND interface standard. For example, communication between the flash memory 60 and the memory controller 50 uses a command latch enable signal CLE, an address latch enable signal ALE, a write enable signal WEn, a read enable signal REn, a ready busy signal RBn, and an input/output signal IO.

The command latch enable signal CLE is a signal representing that the input/output signal IO received by the flash memory 60 is the command CMD. The address latch enable signal ALE is a signal representing that the signal IO received by the flash memory 60 is the address information ADD. The write enable signal WEn is a signal ordering the flash memory 60 to input the input/output signal IO into the flash memory 60. The read enable signal REn is a signal ordering the flash memory 60 to output the input/output signal IO to the memory controller 50.

The ready busy signal RBn is a signal notifying the memory controller 50 of the ready state or busy state of the flash memory 60. The ready state is a state in which the flash memory 60 accepts the command from the memory controller 50. The busy state is a state in which the flash memory 60 does not accept the command.

The input/output signal IO can include the controller command CMD, the address information ADD, and the data DT. The input/output signal IO is, for example, an 8-bit signal (signal set).

In the NAND flash memory 60, a control unit called a plane is sometimes formed by a configuration (control unit)

including the memory cell array 61, the row control circuit 66, and the sense amplifier circuit 67.

For example, the memory system 500 is an SSD (Solid State Drive), a UFS (Universal Flash Storage) device, a memory card, a USB (Universal Serial Bus) memory, or the like.

Instead of the NAND flash memory 60, another nonvolatile or volatile memory device may be used for the memory system 500.

For example, in the memory system 500, each of the interface circuits 55, 54, and 68 includes a transmitting circuit (transceiver) TX and a receiving circuit (receiver) RX.

The transmitting circuit TX transmits various signals (for example, data).

The receiving circuit RX receives various signals (for example, data). For example, in the memory system 500, the memory controller 50 can perform various processes on data from the receiving circuit RX. The flash memory 60 can store the processed data (or unprocessed data) from the receiving circuit RX. The data stored in the flash memory 60 corresponds to the signal output from the receiving circuit RX and processed under the control of the control circuit.

For example, the transmitting circuit TX and the receiving circuit RX are used for relatively high-speed data transfer at 10 Gbps or higher (for example, 100-Gbps class data transfer).

In the memory system according to the embodiment, the receiving circuit RX includes an analog-to-digital conversion circuit (to be also referred to as an ADC circuit).

Receiving Circuit

Figure 4:
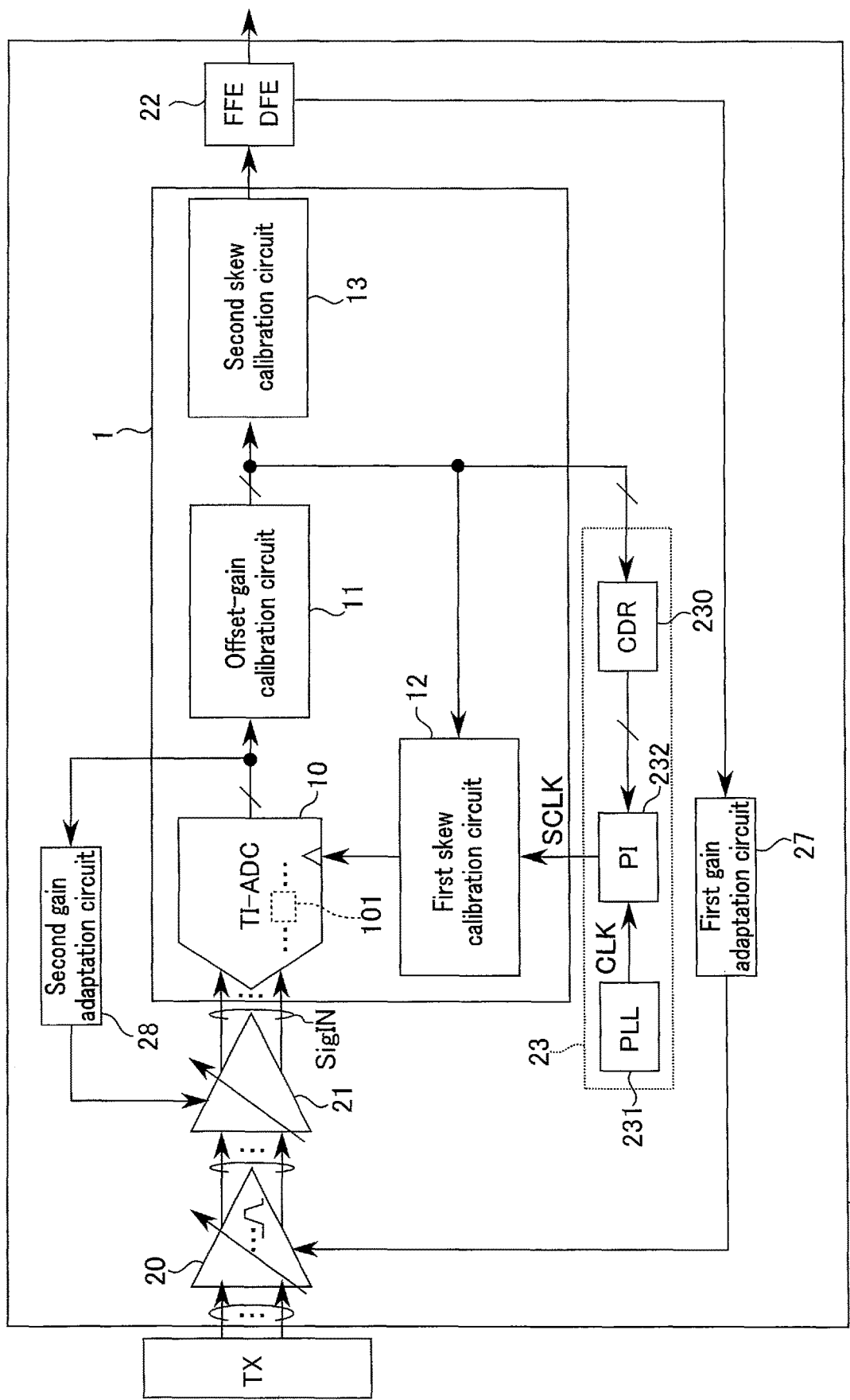
FIG. 4 is a block diagram showing a circuit configuration of a receiving circuit according to the embodiment.

FIG. 4 is a block diagram showing a circuit configuration of the receiving circuit according to the embodiment.

The receiving circuit RX includes an analog-to-digital conversion receiving circuit (to be referred to as an ADC receiving circuit) 1 according to the embodiment, a first equalizer circuit 20, a variable gain amplifier circuit 21, a second equalizer circuit 22, a first gain adaptation circuit 27, a second gain adaptation circuit 28, and a clock generation circuit 23.

The ADC receiving circuit 1 samples a signal (for example, a signal of a given data width) supplied to the receiving circuit RX. The ADC receiving circuit 1 includes a plurality of circuits that perform calibration processing regarding transmission of a signal (data). In the embodiment, the ADC receiving circuit 1 includes circuits (to be referred to as skew calibration circuits) 12 and 13 for performing a calibration regarding a timing skew in signal sampling.

For example, the ADC receiving circuit 1 includes a time interleave ADC circuit (to be referred to as a TI-ADC circuit) 10, an offset-gain calibration circuit 11, the first skew calibration circuit 12, and the second skew calibration circuit 13.

Details of the configuration of the ADC receiving circuit 1 will be described later.

The equalizer circuit 20 receives a signal (to be referred to as a received signal or an input signal) of the given data width from the transmitting circuit TX of another device. The equalizer circuit 20 outputs a signal obtained by performing various signal processes (for example, equalizing processing) on the received signal. For example, the equalizer circuit 20 is a continuous time linear equalizer (CTLE).

The CTLE 20 compensates by a high-pass filter for a loss generated on a transmission path and can reduce the jitter to the received signal.

The variable gain amplifier circuit (VGA circuit) 21 amplifies (or attenuates) a signal from the equalizer circuit 20 in accordance with a set gain. The VGA circuit 21 outputs an amplified signal based on the set gain to the TI-ADC circuit 10. For example, the amplified signal is supplied to the TI-ADC circuit 10.

The equalizer circuit 22 receives a signal (digital signal) from the ADC receiving circuit 1. The equalizer circuit 22 performs various processes on the supplied signal for compensation and reduction of jitter (for example, ISI jitter). The equalizer circuit 22 outputs a signal having undergone various processes to a circuit subsequent to the receiving circuit RX. The equalizer circuit 22 includes at least either of a FFE (Feed Forward Equalizer) circuit and a DFE (Decision Feedback Equalizer) circuit.

The first gain adaptation circuit 27 adjusts a gain of the equalizer circuit 20 based on information from the equalizer circuit 22.

The second gain adaptation circuit 28 adjusts the gain of the VGA circuit 21 based on information (for example, an output signal from the TI-ADC circuit 10) from the ADC receiving circuit 1.

The clock generation circuit 23 supplies one or more clocks (to be referred to as sampling clocks) SCLK to the ADC receiving circuit 1 for sampling of the received signal.

For example, the clock generation circuit 23 includes a PLL (Phase Locked Loop) circuit 231, a phase interpolation (PI) circuit 232, and a clock data recovery (CDR) circuit 230.

The PLL circuit 231 supplies a reference clock CLK to the PI circuit 232.

The CDR circuit 230 extracts a clock from a signal on a transmission path (to be referred to as a CDR path) connected to the CDR circuit 230 based on information (for example, a signal from the offset-gain calibration circuit 11) from the ADC receiving circuit 1. The CDR circuit 230 supplies a signal based on the extracted clock to the PI circuit 232.

The PI circuit 232 generates one or more sampling clocks SCLK based on the signal (reference clock CLK) from the PLL circuit 231 and the signal from the CDR circuit 230. The PI circuit 232 outputs the generated sampling clocks SCLK to the ADC receiving circuit 1 (for example, the first skew calibration circuit 12).

In the ADC receiving circuit 1, the TI-ADC circuit 10 receives, for example, one or more sampling clocks SCLK from the clock generation circuit 23 via the first skew calibration circuit 12.

(ADC Receiving Circuit)

As shown in FIG. 4, the ADC receiving circuit 1 in the receiving circuit RX includes the TI-ADC circuit 10, the offset-gain calibration circuit 11, the first skew calibration circuit 12, and the second skew calibration circuit 13.

With the following configuration, the ADC receiving circuit 1 performs calibration processing for reducing an influence of a skew at the time of sampling.

The TI-ADC circuit 10 receives a signal (analog signal) from the VGA circuit 21. The TI-ADC circuit 10 samples the analog signal and converts the sampled signal into a digital signal.

The TI-ADC circuit 10 is the time interleave ADC circuit. The TI-ADC circuit 10 includes a plurality of analog-to-digital converters (to be also referred to as sub-ADCs) 101. The sub-ADCs 101 are provided in a circuit region (called, for example, an ADC array) in the TI-ADC circuit 10. Each sub-ADC 101 functions as a channel on the signal path of the receiving circuit 1.

The configuration of the TI-ADC circuit 10 will be described later.

The TI-ADC circuit 10 supplies the sampled digital signal to the offset-gain calibration circuit 11 and the second gain adaptation circuit 28.

The offset-gain calibration circuit 11 calibrates a magnitude of an offset and that of a gain in regard to the signal from the TI-ADC circuit 10. The offset-gain calibration circuit 11 supplies, to the first skew calibration circuit 12, the second skew calibration circuit 13, and the clock generation circuit 23, a signal of which the offset and the gain have been calibrated.

The first skew calibration circuit 12 and the second skew calibration circuit 13 calibrate the timing skew.

The first skew calibration circuit 12 extracts information (to be referred to as timing skew information) about a mismatch of the timing skew of each sub-ADC (channel) 101. The first skew calibration circuit 12 adjusts the sampling clock SCLK based on the timing skew information.

The first skew calibration circuit 12 digitally estimates the timing skew of the supplied signal and calibrates (and corrects) the timing skew in an analog manner.

An output signal of the TI-ADC circuit 10 in which a calibration result of the first skew calibration circuit 12 is reflected is supplied to a circuit block (for example, the CDR circuit 230) for which a relatively short delay is desirable. This reduces the delay arising from calibration.

The second skew calibration circuit 13 finely adjusts an error arising from the timing skew.

The second skew calibration circuit 13 digitally estimates the timing skew of the supplied signal (for example, the signal in which the result of calibration by the first skew calibration circuit 12 is reflected), and digitally calibrates (and corrects) the timing skew.

A calibration result of the second skew calibration circuit 13 is supplied to a circuit block (for example, the FFE/DFE circuit 22) on which the influence of the delay by digital correction is relatively small.

Figure 5:
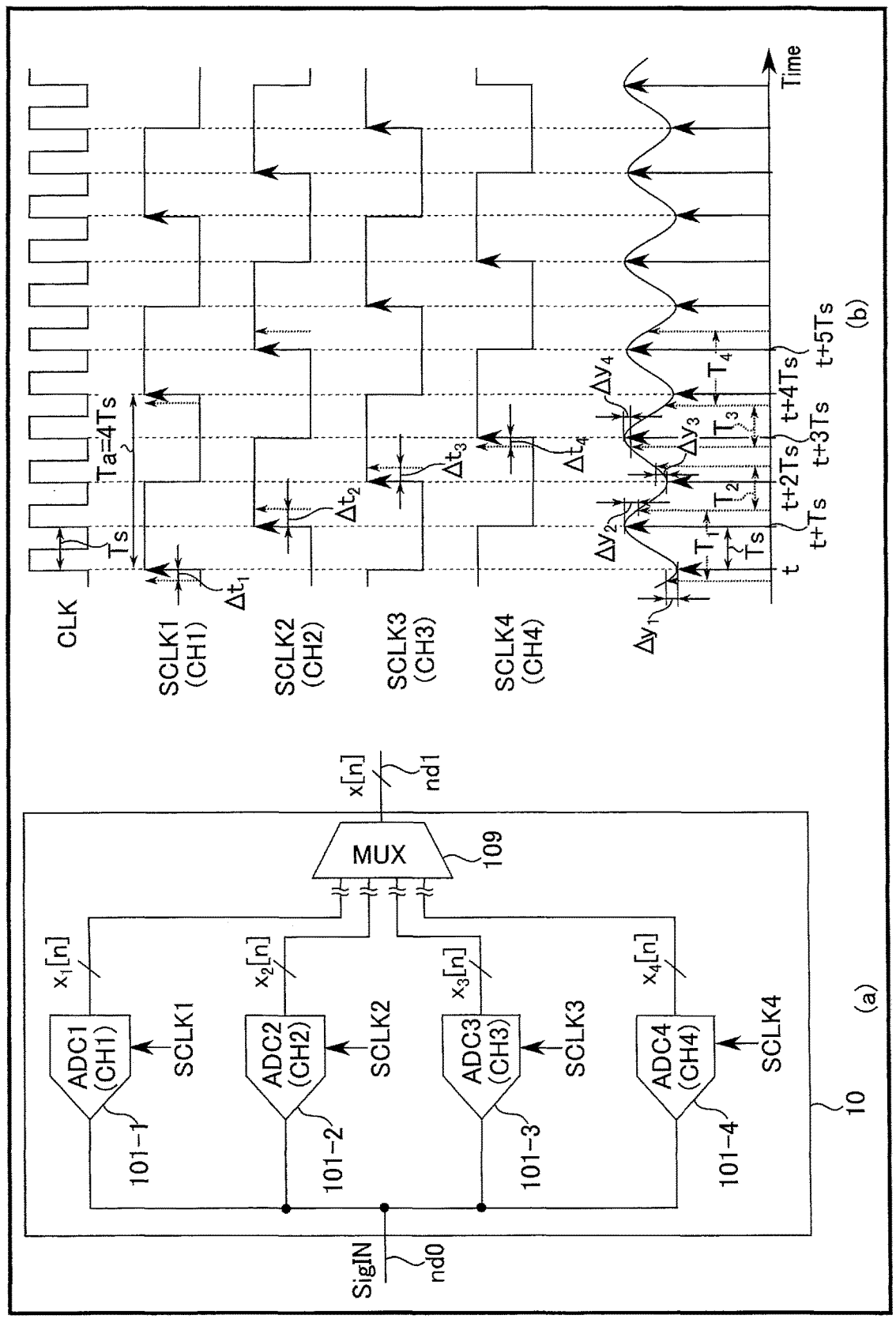
FIG. 5 is a diagram for explaining an example of a configuration of a TI-ADC circuit according to the embodiment.

FIG. 5 is a diagram for explaining an example of the configuration of the TI-ADC circuit.

In FIG. 5, diagram (a) shows the circuit configuration of the TI-ADC circuit. In FIG. 5, diagram (b) shows a sampling operation of the TI-ADC circuit.

The sub-ADCs 101 (101-1, 101-2, 101-3, and 101-4) are connected in parallel between an input node nd0 and a multiplexer 109. In the example of FIG. 5, the TI-ADC circuit 10 includes the four sub-ADCs 101-1, 101-2, 101-3, and 101-4. In this case, the TI-ADC circuit 10 has four channels CH1, CH2, CH3, and CH4.

Note that the number of channels shown in FIG. 5 is merely an example, and the number of channels of the TI-ADC circuit 10 may be a channel number (for example, two) smaller than four or a channel number (for example, eight or 16) larger than four.

The respective sub-ADCs 101 respectively sample a signal SigIN based on the sampling clocks SCLK (SCLK1, SCLK2, SCLK3, and SCLK4). The respective sub-ADCs 101 output signals (to be referred to as sampling signals) $x_1[n]$, $x_2[n]$, $x_3[n]$, and $x_4[n]$ of the sampling results of the signal SigIN, respectively.

For example, each sub-ADC 101 can transfer the sampling signal at the given data width.

The multiplexer 109 sequentially outputs the signals $x_1[n]$, $x_2[n]$, $x_3[n]$, and $x_4[n]$ from the sub-ADCs 101 to an output node nd1 in a particular cycle. As a result, the output signals (digital signals) of the TI-ADC circuit 10 are transferred to a subsequent circuit.

Each of the sub-ADCs 101 receives a corresponding one of the sampling clocks SCLK (SCLK1, SCLK2, SCLK3, and SCLK4). The sampling clock SCLK1 is supplied to the sub-ADC 101-1. The sampling clock SCLK2 is supplied to the sub-ADC 101-2. The sampling clock SCLK3 is supplied to the sub-ADC 101-3. The sampling clock SCLK4 is supplied to the sub-ADC 101-4.

Each of the sampling clocks SCLK1, SCLK2, SCLK3, and SCLK4 is supplied to a corresponding one of the sub-ADCs 101 via a corresponding one of different signal paths (clock paths). The sub-ADCs 101 perform the sampling operation on the supplied signal SigIN based on the different sampling clocks SCLK.

In FIG. 5, diagram (b) is a schematic view for explaining the sampling operation of the TI-ADC circuit and the sub-ADCs.

For example, the reference clock CLK representing the operation timing of the TI-ADC circuit 10 has a cycle "Ts". The sampling clocks SCLK1, SCLK2, SCLK3, and SCLK4 have a cycle "Ta". The cycle "Ta" is four times as long as the cycle "Ts". The phases (timings of the leading or trailing edges of signals of the sampling clocks SCLK) of the sampling clocks SCLK1, SCLK2, SCLK3, and SCLK4 shift by "Ta/4 (=Ts)". The sampling clocks SCLK1, SCLK2, SCLK3, and SCLK4 desirably repetitively change in amplitude between "H" level (first level) and "L" level (second level) in a given cycle.

In FIG. 5, diagram (b) shows an example when the duty cycle of the sampling clocks SCLK1, SCLK2, SCLK3, and SCLK4 is 50%. However, the duty cycle of the sampling clocks SCLK1, SCLK2, SCLK3, and SCLK4 need not always be 50%. For example, the duty cycle of the sampling clocks SCLK1, SCLK2, SCLK3, and SCLK4 may be 25%, 37.5%, or 75%.

The respective sub-ADCs 101 sample the input signal SigIN in the cycle "Ta". The respective sub-ADCs 101 sample the temporally continuous input signal SigIN at different timings. The multiplexer 109 switches the signal paths between the sub-ADCs 101 and the output node nd1 in the cycle "Ts".

Hence, the TI-ADC circuit 10 can transfer, as an output signal to a subsequent circuit, a signal substantially the same as a signal obtained by sampling the input signal SigIN at a timing synchronized with the cycle Ts of the reference clock CLK.

In the sub-ADCs 101, timing skews (to be also simply referred to as skews) of given magnitudes $\Delta t$ ($\Delta t_1$, $\Delta t_2$, $\Delta t_3$, and $\Delta t_4$) with respect to the sampling operation of the signal may arise from phase shifts (for example, shifts of the timings of leading edges) of the sampling clocks SCLK.

Owing to the timing skews, the magnitudes of sampled signals shift by amounts $\Delta y$ ($\Delta y_1$, $\Delta y_2$, $\Delta y_3$, and $\Delta y_4$) corresponding to the shifts of the sampling timings.

The influence of the timing skew $\Delta t$ on the output signal of the TI-ADC circuit 10 may further increase due to a mismatch between channels arising from the difference in operation characteristics between the channels (sub-ADCs 101), the difference in phase shift between the sampling clocks, and the like. For example, a mismatch (to be also referred to as a timing skew mismatch) between sampling periods $T_1$, $T_2$, $T_3$, and $T_4$ arising from a channel timing skew is generated in regard to a plurality of channels having adjacent sampling timings.

As a result, sampling is not performed at equal intervals on a plurality of channels.

The skew may impair the output characteristics and output performance of the ADC receiving circuit 1.

In the embodiment, the ADC receiving circuit 1 reduces the influence of the timing skew using the first skew calibration circuit 12 and the second skew calibration circuit 13.

Note that the ADC receiving circuit 1 according to the embodiment may be used in the receiving circuit RXsv of the server 900 and the receiving circuit RXhst of the host device 700.

(b) First Skew Calibration Circuit

FIG. 6 is a block diagram for explaining an example of a configuration of the first skew calibration circuit according to the embodiment.

As shown in FIG. 6, the first skew calibration circuit 12 includes a first skew estimation circuit 121 and a first skew correction circuit 122.

The first skew calibration circuit 12 performs coarse calibration processing by digital skew estimation (detection) processing and analog skew correction processing in order to suppress the delay of the operation.

In the following description, the first skew calibration circuit 12 will also be called a coarse skew calibration circuit 12.

The first skew estimation circuit 121 receives sampling signals $x_{1\ldots M}[n]$ from M sub-ADCs (channels) 101-1 to 101-M of the TI-ADC circuit 10 via the offset-gain calibration circuit 11.

By various processes on the supplied signals, the first skew estimation circuit 121 calculates (detects and estimates) a magnitude (to be referred to as a skew amount) $\Delta t_{coarse}$ of a skew generated in the sampling signals $x_{1\ldots M}[n]$.

The first skew estimation circuit 121 supplies the skew amount $\Delta t_{coarse}$ based on the calculation result to the first skew correction circuit 122.

The first skew correction circuit 122 receives the skew amount $\Delta t_{coarse}$. The first skew correction circuit 122 receives the sampling clock SCLK from the clock generation circuit 23.

By analog processing, the first skew correction circuit 122 calculates the correction amount (for example, the shift amount of the timing of the leading or trailing edge of the signal) of the sampling clock SCLK based on the skew amount $\Delta t_{coarse}$ The first skew correction circuit 122 corrects the sampling clock SCLK based on the calculation result.

In the embodiment, the first skew estimation circuit 121 calculates a moving average (MA) of the difference between sampling signals of two adjacent channels. Based on the value of the moving average (to be referred to as the moving average value or MA value), the first skew estimation circuit 121 calculates a correction amount for correcting the sampling clock.

The first skew estimation circuit 121 includes a moving average calculation circuit 204. The moving average calculation circuit 204 calculates the moving average MA regarding the sampling signals $x_{1\ldots M}[n]$. Instead of the moving average calculation circuit 204, a circuit (to be referred to as an average value calculation circuit) that calculates the average value of a plurality of supplied signals (signal values) may be used in the first skew estimation circuit 121.

Concept

A concept of calibration processing regarding the skew by the coarse calibration circuit according to the embodiment will be described with reference to FIGS. 7, 8, and 9.

Figure 7:
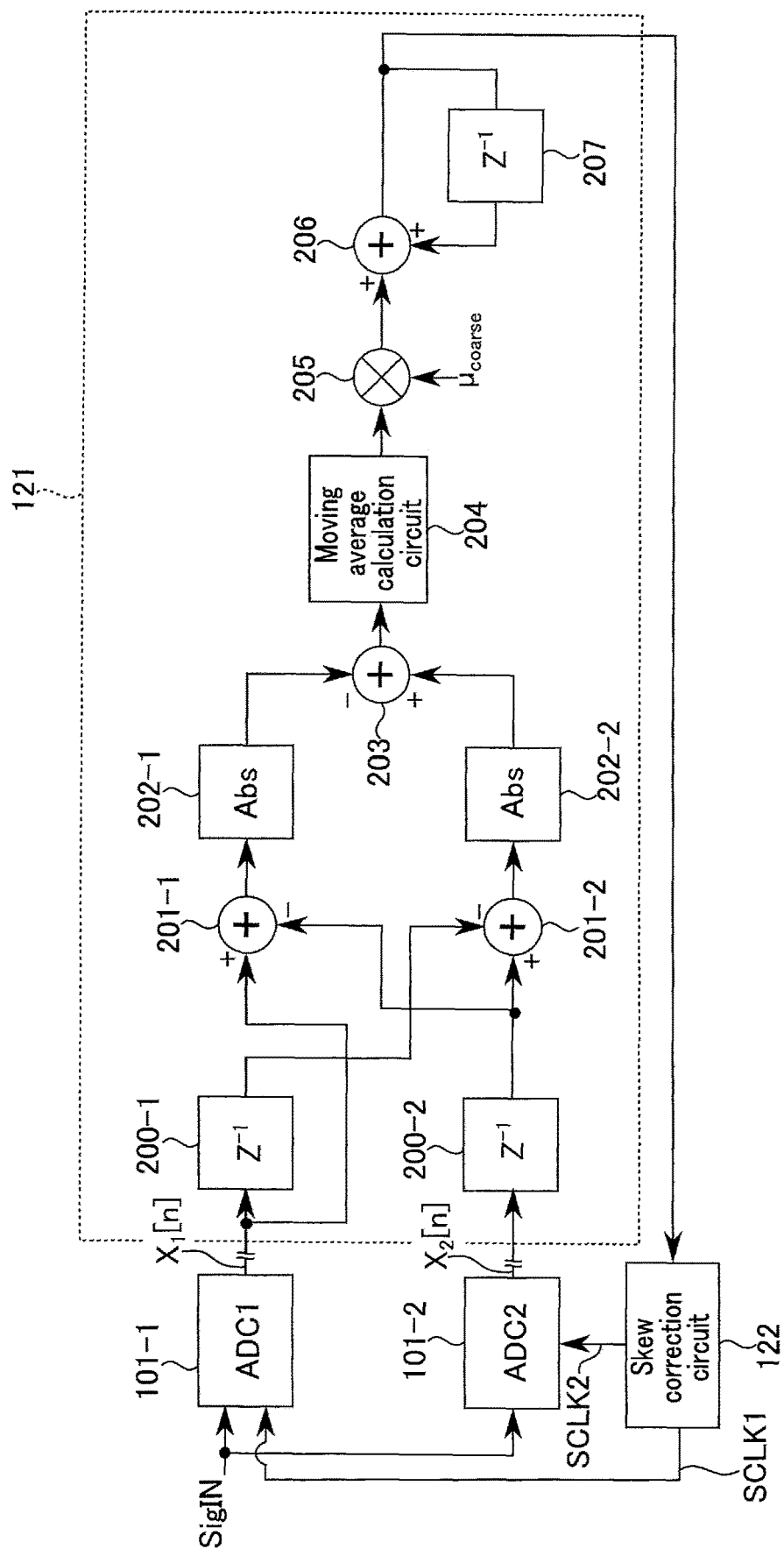
FIG. 7 is a circuit diagram for explaining an internal configuration of a skew estimation circuit according to the embodiment.

FIG. 7 is a circuit diagram for explaining an internal configuration of the skew estimation circuit according to the embodiment.

FIG. 7 shows the first skew estimation circuit 121 for the two channels CH1 and CH2. In FIG. 7, an illustration of constituent elements (for example, the multiplexer 109) other than the sub-ADCs in the TI-ADC circuit 10 and the offset-gain calibration circuit 11 is omitted.

In the TI-ADC circuit 10 in the example of FIG. 7, the sub-ADC 101-1 corresponds to the first channel CH1, and the sub-ADC 101-2 corresponds to the second channel CH2. The sub-ADC 101-2 samples the input signal SigIN in a particular period after sampling of the input signal SigIN in the sub-ADC 101-1.

As shown in FIG. 7, the first skew estimation circuit 121 of the coarse skew calibration circuit 12 includes a plurality of processors (calculation circuits) that perform various processes on the sampling signals $x_1[n]$ and $x_2[n]$ of the input signal SigIN.

For example, the first skew estimation circuit 121 includes a plurality of delay circuits ($Z^{-1}$) 200 (200-1 and 200-2) and 207, a plurality of addition circuits (adders) 201 (201-1 and 201-2), 203, and 206, a plurality of absolute value conversion circuits (Abs) 202 (202-1 and 202-2), a moving average calculation circuit 204, and a multiplication circuit (multiplier) 205.

An input node of the sub-ADC 101-1 is connected to an input node of the TI-ADC circuit 10. An output node of the sub-ADC 101-1 is connected to an input node of the delay circuit 200-1 and a positive input node of the addition circuit 201-1. An output signal (sampling signal) $x_1[n]$ of the sub-ADC 101-1 that is sampled at a given timing (time instance) is supplied to the delay circuit 200-1 and the addition circuit 201-1.

The input node of the delay circuit 200-1 is connected to the output node of the sub-ADC 101-1. An output node of the delay circuit 200-1 is connected to a negative input node of the addition circuit 201-2. An output signal of the delay circuit 200-1 becomes negative and is supplied to the addition circuit 201-2.

The delay circuit 200-1 adds a delay amount of a given magnitude to the sampling signal $x_1[n]$.

An input node of the sub-ADC 101-2 is connected to the input node of the TI-ADC circuit 10. An output node of the sub-ADC 101-2 is connected to an input node of the delay circuit 200-2. The sampling signal $x_2[n]$ of the sub-ADC 101-2 is supplied to the delay circuit 200-2.

The input node of the delay circuit 200-2 is connected to the output node of the sub-ADC 101-2. An output node of the delay circuit 200-2 is connected to a negative input node of the addition circuit 201-1 and a positive input node of the addition circuit 201-2. An output signal of the delay circuit 200-2 becomes negative and is supplied to the addition circuit 201-1. An output signal of the delay circuit 200-2 becomes positive and is supplied to the addition circuit 201-2.

The delay circuit 200-2 adds a delay amount of a given magnitude to the sampling signal $x_2[n]$. For example, the delay amount of the delay circuit 200-2 is equal to that of the delay circuit 200-1.

The positive input node of the addition circuit 201-1 is connected to the output node of the sub-ADC 101-1. The negative input node of the addition circuit 201-1 is connected to the output node of the delay circuit 200-2. An output node of the addition circuit 201-1 is connected to an input node of the absolute value conversion circuit 202-1.

The addition circuit 201-1 performs subtraction processing on the output signal of the sub-ADC 101-1 and the output signal (output signal from the sub-ADC 101-2 including the delay amount) of the delay circuit 200-2. The addition circuit 201-1 obtains a value (difference value) as a calculation result by subtracting a signal (for example, a signal value of the delay signal of the channel CH2) regarding the channel CH2 from a signal (for example, a signal value of the channel CH1) regarding the channel CH1. The addition circuit 201-1 outputs a calculation result to the absolute value conversion circuit 202-1.

The positive input node of the addition circuit 201-2 is connected to the output node of the delay circuit 200-2. The negative input node of the addition circuit 201-2 is connected to the output node of the delay circuit 200-1. An output node of the addition circuit 201-2 is connected to an input node of the absolute value conversion circuit 202-2.

The addition circuit 201-2 performs subtraction processing on the output signal (output signal from the sub-ADC 101-1 including the delay amount) of the delay circuit 200-1 and the output signal (output signal from the sub-ADC 101-2 including the delay amount) of the delay circuit 200-2. The addition circuit 201-2 obtains a value as a calculation result by subtracting a signal (for example, the signal value of the delay signal of the channel CH1) regarding the channel CH1 from a signal (for example, the signal value of the delay value of the channel CH2) regarding the channel CH2. The addition circuit 201-2 outputs the calculation result to the absolute value conversion circuit 202-2.

The input node of the absolute value conversion circuit 202-1 is connected to the addition circuit 201-1. An output node of the absolute value conversion circuit 202-1 is connected to a negative input node of the addition circuit 203.

The absolute value conversion circuit 202-1 converts a signal value of an output signal from the addition circuit 201-1 into an absolute value. The absolute value conversion circuit 202-1 outputs an absolute value of the output signal of the addition circuit 201-1 to the addition circuit 203.

The input node of the absolute value conversion circuit 202-2 is connected to the addition circuit 201-2. An output node of the absolute value conversion circuit 202-2 is connected to the positive input node of the addition circuit 203.

The absolute value conversion circuit 202-2 converts a signal value of an output signal from the addition circuit 201-2 into an absolute value. The absolute value conversion circuit 202-2 outputs an absolute value of an output signal of the addition circuit 201-2 to the addition circuit 203.

The negative input node of the addition circuit 203 is connected to the output node of the absolute value conversion circuit 202-1. The positive input node of the addition circuit 203 is connected to the output node of the absolute value conversion circuit 202-2. An output node of the addition circuit 203 is connected to an input node of the moving average calculation circuit 204.

The addition circuit 203 performs subtraction processing on an output signal (absolute value of the output signal of the addition circuit 201-1) of the absolute value conversion circuit 202-1 and an output signal (absolute value of the output signal of the addition circuit 201-2) of the absolute value conversion circuit 202-2. The addition circuit 203 outputs a result of calculation processing to the moving average calculation circuit 204.

The input node of the moving average calculation circuit 204 is connected to the output node of the addition circuit 203. An output node of the moving average calculation circuit 204 is connected to an input node of the multiplication circuit 205.

The moving average calculation circuit 204 sequentially receives signals corresponding to sampling signals at the sampling timings of the respective sub-ADCs 101. The moving average calculation circuit 204 performs moving average calculation processing regarding to the supplied signals.

The input node of the multiplication circuit 205 is connected to the output node of the moving average calculation circuit 204. An output node of the multiplication circuit 205 is connected to one input node of the addition circuit 206. A coefficient (parameter) $\mu_{coarse}$ of a given magnitude is supplied to the multiplication circuit 205.

The multiplication circuit 205 performs multiplication processing on a calculation result of the moving average calculation circuit 204 and the coefficient $\mu_{coarse}$. The multiplication circuit 205 outputs a calculation result of the multiplication processing to the addition circuit 206.

One input node of the addition circuit 206 is connected to the output node of the multiplication circuit 205. The other input node of the addition circuit 206 is connected to an output node of the delay circuit 207. An output node of the addition circuit 206 is connected to the first skew correction circuit 122 and an input node of the delay circuit 207.

The addition circuit 206 performs addition processing on an output signal of the multiplication circuit 205 and an output signal of the delay circuit 207. The addition circuit 206 outputs a calculation result to the delay circuit 207 and the first skew correction circuit 122.

The input node of the delay circuit 207 is connected to the output node of the addition circuit 206. An output node of the delay circuit 207 is connected to the other input node of the addition circuit 206. The delay circuit 207 applies a delay amount of a given magnitude to the output signal of the addition circuit 206. The delay circuit 207 outputs a delay amount-applied signal to the addition circuit 206. In this manner, the signal including the delay amount is fed back to the addition circuit 206. For example, the delay amount of the delay circuit 207 is set in accordance with the operation timing of the addition circuit 206.

Figure 8:
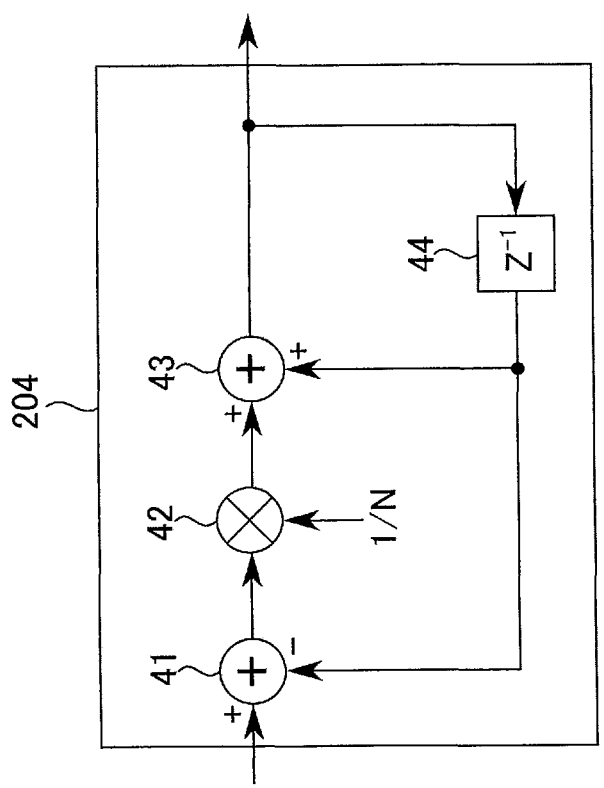
FIG. 8 is a circuit diagram showing an example of an internal configuration of a moving average calculation circuit.

FIG. 8 is a circuit diagram showing an example of an internal configuration of the moving average calculation circuit.

As shown in FIG. 8, the moving average calculation circuit 204 includes an addition circuit 41, a multiplication circuit 42, an addition circuit 43, and a delay circuit 44.

A positive input node of the addition circuit 41 is connected to the output node of the above-described addition circuit 203. A negative input node of the addition circuit 41 is connected to an output node of the delay circuit 44. An output node of the addition circuit 41 is connected to an input node of the multiplication circuit 42.

The addition circuit 41 performs subtraction processing on a calculation result of the addition circuit 203 and an output signal of the delay circuit 44. The addition circuit 41 outputs a calculation result to the multiplication circuit 42.

The input node of the multiplication circuit 42 is connected to the addition circuit 41. An output node of the multiplication circuit 42 is connected to the addition circuit 43. A coefficient (parameter) "1/N" of a given magnitude is supplied to the multiplication circuit 42. "N" is a value representing the number of signals (number of sampling of signals) subjected to moving average calculation processing.

The multiplication circuit 42 performs multiplication processing on a calculation result of the addition circuit 41 and the coefficient (1/N). The multiplication circuit 42 outputs a calculation result to the addition circuit 43.

One input node of the addition circuit 43 is connected to the output node of the multiplication circuit 42. The other input node of the addition circuit 43 is connected to the output node of the delay circuit 44. An output node of the addition circuit 43 is connected to an input node of the delay circuit 44 and the input node of the above-described multiplication circuit 205.

The addition circuit 43 performs addition processing on an output signal of the multiplication circuit 42 and an output signal of the delay circuit 44. The addition circuit 43 outputs a calculation result to the delay circuit 44 and the multiplication circuit 205.

The input node of the delay circuit 44 is connected to the output node of the addition circuit 43. An output node of the delay circuit 44 is connected to the negative input node of the addition circuit 41 and the other input node of the addition circuit 43. The delay circuit 44 applies the delay amount of a given magnitude to an output signal of the addition circuit 43. The delay circuit 44 outputs a delay amount-applied signal to the addition circuits 41 and 43. The signal including the delay amount is fed back to the addition circuits 41 and 43. Accordingly, a moving average value of the previous calculation cycle is reflected in a moving average value of the current calculation cycle.

The moving average calculation circuit 204 having the circuit configuration in FIG. 8 calculates the moving average of signals (signal values) regarding N samples (for example, N sampling cycles).

Note that the internal configuration of the moving average calculation circuit 204 is not limited to the example in FIG. 8.

FIG. 9 is a view for explaining a concept of calibration of the timing skew in the ADC receiving circuit according to the embodiment.

In (a) and (b) of FIG. 9, an abscissa of a graph corresponds to a time (sampling time), and an ordinate of the graph corresponds to a signal value of the sampled signal. In FIG. 9, (a) and (b) show a sampling operation in the TI-ADC circuit 10 having two channels as shown in FIG. 7.

As shown in (a) of FIG. 9, for example, the sub-ADC 101-1 of the first channel samples the signal value $x_1[n]$ at a time $t_1[n]$ as sampling processing of the nth (n is an integer of 1 or more) cycle in the TI-ADC circuit 10. At a time $t_2[n]$ after the time $t_1[n]$, the sub-ADC 101-2 of the second channel samples the signal value $x_2[n]$ as the nth sampling processing of the TI-ADC circuit 10.

Subsequent to the nth sampling processing, the TI-ADC circuit 10 performs (n+1)th sampling processing. At a time $t_1[n+1]$ after the time $t_2[n]$, for example, the sub-ADC 101-1 samples a signal value $x_1[n+1]$.

After that, the TI-ADC circuit 10 sequentially performs sampling of the signal value of the second channel and sampling of the signal value of the first channel by the respective sub-ADCs 101.

In the sampling period from the time $t_1[n]$ to the time $t_2[n]$, the difference between the signal value $x_2[n]$ and the signal value $x_1[n]$ is "$x_2[n]-x_1[n]$".

In the sampling period from the time $t_2[n]$ to the time $t_1[n+1]$, the difference between the signal value $x_1[n+1]$ and the signal value $x_2[n]$ is "$x_1[n+1]-x_2[n]$".

When the mismatch of the sampling timing is not generated in regard to sampling of received signals (signal values of the received signals) on two channels, the sampling periods on the two channels are "Ts".

When the mismatch of the sampling timing is not generated, an average value (to be referred to as Ave$\{|x_2[n]-x_1[n]|\}$) of "$x_2[n]-x_1[n]$" regarding the time (for example, the sampling period) is equal to the average value (to be referred to as Ave$\{|x_1[n+1]-x_2[n]|\}$) of "$x_1[n+1]-x_2[n]$" regarding the time.

As described above, the skew (for example, timing skew) may be generated in the TI-ADC circuit 10. Owing to the skew, a lag "Δt" of the sampling period is added to the sampling period Ts. In this case, the Ave$\{|x_2[n]-x_1[n]|\}$ value may differ from the Ave$\{|x_1[n+1]-x_2[n]|\}$ value.

As shown in (b) of FIG. 9, for example, on two channels CHk (k is an integer of 1 or more) and CHk+1 adjacent to each other in regard to the sampling timing, a skew of $\Delta t_k$ is generated in the sampling clock on a channel CHk, and a skew of $\Delta t_{k+1}$ is generated in the sampling clock on a channel CHk+1.

A sub-ADC 101k of the channel CHk samples a signal $x_k$ at a time $kTs+\Delta t_k$.

A sub-ADC 101k+1 of the channel CHk+1 samples a signal $x_{k+1}$ at a time $k(Ts+1)+\Delta t_{k+1}$.

When the mismatch of the sampling timing is generated due to the timing skew, the moving average of the difference $(x_{k+1}-x_k)$ between the signal values of the sampling signals $x_k$ and $x_{k+1}$ on the two temporarily adjacent channels CHk and channel CHk+1 regarding the sampling timing tends to be proportional to the difference $(\Delta t_{k+1}-\Delta t_k)$ between the skew amounts $\Delta t_k$ and $\Delta t_{k+1}$ on the two channels CHk and CHk+1.

In the embodiment, the coarse skew calibration circuit 12 of the ADC receiving circuit 1 calibrates the sampling timing of the signal by an algorithm based on a property in which the moving average value (MA value) of the difference between the signal value $x_k$ of one channel CHk and the signal value $x_{k+1}$ of the other channel CHk+1 is proportional to the difference between the skew amounts $\Delta t_k$ and $\Delta t_{k+1}$ in regard to two adjacent channels.

The coarse skew calibration circuit 12 adjusts (calibrates) the sampling clocks SCLK so that the moving average values of signal differences each between two channels having adjacent sampling timings become equal.

The first skew estimation circuit 121 in FIGS. 7 and 8 performs calculation processing regarding the moving average of signal values between channels. The first skew estimation circuit 121 supplies the calculation result to the first skew correction circuit 122.

Based on the calculation result of the first skew estimation circuit 121, the first skew correction circuit 122 corrects the sampling clocks SCLK1 and SCLK2 with respect to the sub-ADC 101.

The ADC receiving circuit 1 according to the embodiment can reduce the influence of the skew.

Configuration Example

FIG. 10 is a circuit diagram for explaining the skew calibration circuit in the ADC receiving circuit according to the embodiment.

FIG. 10 shows an example of a configuration of the skew calibration circuit in the ADC receiving circuit 1 including a 4-channel TI-ADC circuit 10.

Note that the connection relationship between the constituent elements of the calibration circuit is the same as that in the example of FIG. 7 for the first channel CH1 and the second channel CH2, and a description thereof will be omitted or simplified.

As shown in FIG. 10, the sub-ADCs 101-1, 101-2, 101-3, and 101-4 sample the signal SigIN at timings corresponding to the sampling clocks SCLK1, SCLK2, SCLK3, and SCLK4, respectively. The sub-ADCs 101-1, 101-2, 101-3, and 101-4 output the sampling signals $x_1[n]$, $x_2[n]$, $x_3[n]$, and $x_4[n]$ to the coarse skew calibration circuit 12.

An input node of a delay circuit 200-3 is connected to an output node of the sub-ADC 101-3 corresponding to the third channel CH3. An output node of the delay circuit 200-3 is connected to two addition circuits 201-2 and 201-3. The delay circuit 200-3 applies the delay amount of a given magnitude to a signal from the sub-ADC 101-3.

An input node of a delay circuit 200-4 is connected to an output node of the sub-ADC 101-4 corresponding to the fourth channel CH4. An output node of the delay circuit 200-4 is connected to two addition circuits 201-3 and 201-4. The delay circuit 200-4 applies the delay amount of a given magnitude to a signal from the sub-ADC 101-4.

The negative input node of the addition circuit 201-2 is connected to the output node of the delay circuit 200-2. The positive input node of the addition circuit 201-2 is connected to the output node of the delay circuit 200-3. The output node of the addition circuit 201-2 is connected to the input node of the absolute value conversion circuit 202-2.

The addition circuit 201-2 performs addition processing on a negative value of an output signal of the delay circuit 200-2 and a value of an output signal of the delay circuit 200-3. That is, the addition circuit 201-2 performs the subtraction processing on the output signal of the delay circuit 200-2 and the output signal of the delay circuit 200-3.

The addition circuit 201-2 obtains a value as a calculation result by subtracting a signal (for example, a signal value of the delay signal of the channel CH2) regarding the channel CH2 from a signal (for example, a signal value of the delay signal of the channel CH3) regarding the channel CH3. The addition circuit 201-2 outputs a calculation result to the absolute value conversion circuit 202-2.

A negative input node of the addition circuit 201-3 is connected to the output node of the delay circuit 200-3. A positive input node of the addition circuit 201-3 is connected to the output node of the delay circuit 200-4. An output node of the addition circuit 201-3 is connected to an input node of an absolute value conversion circuit 202-3.

The addition circuit 201-3 performs addition processing on a negative value of an output signal of the delay circuit 200-3 and an output signal of the delay circuit 200-4. That is, the addition circuit 201-3 performs the subtraction processing on a signal value of the output signal of the delay circuit 200-3 and a signal value of the output signal of the delay circuit 200-4.

The addition circuit 201-3 obtains a value as a calculation result by subtracting a signal value (for example, a signal value of the delay signal of the channel CH3) regarding the channel CH3 from a signal value (for example, a signal value of the delay signal of the channel CH4) regarding the channel CH4. The addition circuit 201-3 outputs the calculation result to the absolute value conversion circuit 202-3.

A negative input node of the addition circuit 201-4 is connected to the output node of the delay circuit 200-4. A positive input node of the addition circuit 201-4 is connected to the output node of the sub-ADC 101-1. An output node of the addition circuit 201-4 is connected to an input node of an absolute value conversion circuit 202-4.

The addition circuit 201-4 performs addition processing on a negative value of the output signal of the delay circuit 200-4 and the output signal of the sub-ADC 101-1. That is, the addition circuit 201-4 performs the subtraction process-ing on the signal value of the output signal of the delay circuit 200-4 and the signal value of the output signal of the sub-ADC 101-1.

The addition circuit 201-4 obtains a value as a calculation result by subtracting a signal value (for example, a signal value of the delay signal of the channel CH4) regarding the channel CH4 from a signal value (for example, a signal value of the delay signal of the channel CH1) regarding the channel CH1. The addition circuit 201-4 outputs the calculation result to the absolute value conversion circuit 202-4.

The input node of the absolute value conversion circuit 202-2 is connected to the output node of the addition circuit 201-2. The output node of the absolute value conversion circuit 202-2 is connected to addition circuits 203-1 and 203-2.

The absolute value conversion circuit 202-2 converts a signal value of the output signal of the addition circuit 201-2 into an absolute value.

An input node of the absolute value conversion circuit 202-3 is connected to the output node of the addition circuit 201-3. An output node of the absolute value conversion circuit 202-3 is connected to the addition circuit 203-2 and an addition circuit 203-3.

The absolute value conversion circuit 202-3 converts a signal value of an output signal of the addition circuit 201-3 into an absolute value.

An input node of the absolute value conversion circuit 202-4 is connected to the output node of the addition circuit 201-4. An output node of the absolute value conversion circuit 202-4 is connected to the addition circuit 203-3.

The absolute value conversion circuit 202-4 converts a signal value of an output signal of the addition circuit 201-4 into an absolute value.

A positive input node of the addition circuit 203-1 is connected to the output node of the absolute value conversion circuit 202-1. A negative input node of the addition circuit 203-1 is connected to the output node of the absolute value conversion circuit 202-2. An output node of the addition circuit 203-1 is connected to a first moving average calculation circuit 204-1.

The addition circuit 203-1 performs the subtraction processing on an output signal of the absolute value conversion circuit 202-1 and an output signal of the absolute value conversion circuit 202-2. The addition circuit 203-1 obtains a value by subtracting an absolute value of the output signal of the addition circuit 201-2 from an absolute value of the output signal of the addition circuit 201-1. The addition circuit 203-1 outputs a calculation result to the first moving average calculation circuit 204-1.

A positive input node of the addition circuit 203-2 is connected to the output node of the absolute value conversion circuit 202-2. A negative input node of the addition circuit 203-2 is connected to the output node of the absolute value conversion circuit 202-3. An output node of the addition circuit 203-2 is connected to a second moving average calculation circuit 204-2.

The addition circuit 203-2 performs the subtraction processing on the output signal of the absolute value conversion circuit 202-2 and an output signal of the absolute value conversion circuit 202-3. The addition circuit 203-2 obtains a value by subtracting an absolute value of the output signal of the addition circuit 201-3 from an absolute value of the output signal of the addition circuit 201-2. The addition circuit 203-2 outputs a calculation result to the second moving average calculation circuit 204-2.

A positive input node of the addition circuit 203-3 is connected to the output node of the absolute value conversion circuit 202-3. A negative input node of the addition circuit 203-3 is connected to the output node of the absolute value conversion circuit 202-4. An output node of the addition circuit 203-3 is connected to a third moving average calculation circuit 204-3.

The addition circuit 203-3 performs the subtraction processing on the output signal of the absolute value conversion circuit 202-3 and an output signal of the absolute value conversion circuit 202-4. The addition circuit 203-3 obtains a value by subtracting an absolute value of the output signal of the addition circuit 201-4 from an absolute value of the output signal of the addition circuit 201-3. The addition circuit 203-3 outputs a calculation result to the third moving average calculation circuit 204-3.

An input node of the first moving average calculation circuit 204-1 is connected to the output node of the addition circuit 203-1. An output node of the first moving average calculation circuit 204-1 is connected to an input node of a multiplication circuit 205-1.

The first moving average calculation circuit 204-1 calculates a moving average value of a plurality of signals sequentially supplied from the addition circuit 203-1. The first moving average calculation circuit 204-1 outputs the obtained moving average value to the multiplication circuit 205-1.

An input node of the second moving average calculation circuit 204-2 is connected to the output node of the addition circuit 203-2. An output node of the second moving average calculation circuit 204-2 is connected to an input node of a multiplication circuit 205-2.

The second moving average calculation circuit 204-2 calculates a moving average value of a plurality of signals sequentially supplied from the addition circuit 203-2. The second moving average calculation circuit 204-2 outputs the obtained moving average value to the multiplication circuit 205-2.

An input node of the third moving average calculation circuit 204-3 is connected to the output node of the addition circuit 203-3. An output node of the third moving average calculation circuit 204-3 is connected to an input node of a multiplication circuit 205-3.

The third moving average calculation circuit 204-3 calculates a moving average value of a plurality of signals sequentially supplied from the addition circuit 203-3. The third moving average calculation circuit 204-3 outputs the obtained moving average value to the multiplication circuit 205-3.

An input node of the multiplication circuit 205-1 is connected to the output node of the first moving average calculation circuit 204-1. An output node of the multiplication circuit 205-1 is connected to an addition circuit 206-1. The multiplication circuit 205-1 receives a coefficient (for example, weighting factor) $\mu_{coarse1}$.

The multiplication circuit 205-1 multiplies an output signal (signal value) of the first moving average calculation circuit 204-1 by the coefficient $\mu_{coarse1}$. The multiplication circuit 205-1 outputs a calculation result to the addition circuit 206-1.

An input node of the multiplication circuit 205-2 is connected to the output node of the second moving average calculation circuit 204-2. An output node of the multiplication circuit 205-2 is connected to an addition circuit 206-2. The multiplication circuit 205-2 receives a coefficient $\mu_{coarse2}$.

The multiplication circuit 205-2 multiplies an output signal of the second moving average calculation circuit 204-2 by the coefficient $\mu_{coarse2}$. The multiplication circuit 205-2 outputs a calculation result to the addition circuit 206-2.

An input node of the multiplication circuit 205-3 is connected to the output node of the third moving average calculation circuit 204-3. An output node of the multiplication circuit 205-3 is connected to an addition circuit 206-3. The multiplication circuit 205-3 receives a coefficient $\mu_{coarse3}$.

The multiplication circuit 205-3 multiplies an output signal of the third moving average calculation circuit 204-3 by the coefficient circuit $\mu_{coarse3}$. The multiplication 205-3 outputs a calculation result to the addition circuit 206-3.

A first positive input node of the addition circuit 206-1 is connected to the multiplication circuit 205-1. A second positive input node of the addition circuit 206-1 is connected to an output node of a delay circuit 207-1. An output node of the addition circuit 206-1 is connected to an input node of the delay circuit 207-1 and the first skew correction circuit 122.

The addition circuit 206-1 performs addition processing on an output signal of the multiplication circuit 205-1 and an output signal (feedback signal of the addition circuit 206-1 including the delay amount) of the delay circuit 207-1. The addition circuit 206-1 outputs a calculation result to the delay circuit 207-1 and the first skew correction circuit 122.

The calculation result of the addition circuit 206-1 is used as a parameter for correcting the skew generated on the second channel CH2.

A first positive input node of the addition circuit 206-2 is connected to the multiplication circuit 205-2. A second positive input node of the addition circuit 206-2 is connected to an output node of a delay circuit 207-2. An output node of the addition circuit 206-2 is connected to an input node of the delay circuit 207-2 and the first skew correction circuit 122.

The addition circuit 206-2 performs addition processing on an output signal of the multiplication circuit 205-2 and an output signal (feedback signal of the addition circuit 206-2 including the delay amount) of the delay circuit 207-2. The addition circuit 206-2 outputs a calculation result to the delay circuit 207-2 and the first skew correction circuit 122.

The calculation result of the addition circuit 206-2 is used as a parameter for correcting the skew generated on the third channel CH3.

A first positive input node of the addition circuit 206-3 is connected to the multiplication circuit 205-3. A second positive input node of the addition circuit 206-3 is connected to an output node of a delay circuit 207-3. An output node of the addition circuit 206-3 is connected to an input node of the delay circuit 207-3 and the first skew correction circuit 122.

The addition circuit 206-3 performs addition processing on an output signal of the multiplication circuit 205-3 and an output signal (feedback signal of the addition circuit 206-3 including the delay amount) of the delay circuit 207-3. The addition circuit 206-3 outputs a calculation result to the delay circuit 207-3 and the first skew correction circuit 122.

The calculation result of the addition circuit 206-3 is used as a parameter for correcting the skew generated on the fourth channel CH4.

Calculation Processing

Calculation processing for skew calibration is executed by the circuit in FIG. 10 in the following way.

As shown in (b) of FIG. 9, a difference $\Delta x_k[n]$ between the signal value $x_k[n]$ of the channel CHk and the signal value $x_{k+1}[n]$ of the channel CHk+1 in sampling of the nth cycle is given by equation (eq0):

$$\Delta x_k[n] = x_{k+1}[n] - x_k[n] \approx (Ts + \Delta t_{k+1} - \Delta t_k) \times (dx_k[n]/dt) \quad \text{(eq 0)}$$

where "Ts" is the sampling period, "$\Delta t_{k+1}$" is the skew amount on the channel CHk+1, "$\Delta t_k$" is the skew amount on the channel CHk, and "$dx_k[n]/dt$" is the slope of the signal value $x_k[n]$ regarding the time.

As shown in FIG. 10, when the TI-ADC circuit has the four channels CH1, CH2, CH3, and CH4, equations (eq1a), (eq1b), (eq1c), and (eq1d) are obtained based on equation (eq0) for two adjacent channels.

Note that the channel CH1 is used as a channel adjacent to the channel CH4 regarding the theoretical sampling timing. The signal value $x_4[n]$ of the channel CH4 in the nth cycle and the signal value $x_1[n+1]$ of the channel CH1 in the (n+1)th cycle are used as calculation targets.

$$\Delta x_1[n] = (Ts + \Delta t_2 - \Delta t_1) \times dx_1[n]/dt \quad \text{(eq 1a)}$$

$$\Delta x_2[n] = (Ts + \Delta t_3 - \Delta t_2) \times dx_2[n]/dt \quad \text{(eq 1b)}$$

$$\Delta x_3[n] = (Ts + \Delta t_4 - \Delta t_3) \times dx_3[n]/dt \quad \text{(eq 1c)}$$

$$\Delta x_4[n] = x_1[n+1] - x_4[n] = (Ts + \Delta t_1 - \Delta t_4) \times dx_4[n]/dt \quad \text{(eq 1d)}$$

The channels CH1, CH2, CH3, and CH4 (sub-ADCs 101-1, 101-2, 101-3, and 101-4) sample the same input signal SigIN. When the number "N" of samples subjected to calculation processing of the moving average "MA" in each moving average calculation circuit 204 is sufficiently large, the average values of the slopes "$dx_k[n]/dt$" of equations (eq1a) to (eq1d) described above have a same value (for example, "A"). For example, in the embodiment, the moving average "MA{$|dx_k[n]/dt|$}" of the slope of a signal of each channel CH takes a given value (coefficient or parameter) "A".

In calculation of the moving average (MA) regarding the signal of each channel CH, equations (eq2a) to (eq2d) are obtained based on equations (eq1a) to (eq1d) described above:

$$MA\{|\Delta x_1[n]|\} = A(Ts + \Delta t_2 - \Delta t_1) \quad \text{(eq2a)}$$

$$MA\{|\Delta x_2[n]|\} = A(Ts + \Delta t_3 - \Delta t_2) \quad \text{(eq2b)}$$

$$MA\{|\Delta x_3[n]|\} = A(Ts + \Delta t_4 - \Delta t_3) \quad \text{(eq2c)}$$

$$MA\{|\Delta x_4[n]|\} = A(Ts + \Delta t_1 - \Delta t_4) \quad \text{(eq2d)}$$

In equations (eq2a) to (eq2d), "MA" means that the equation (or function or numerical value) is related to the moving average.

Based on equations (eq2a) to (eq2d), equations regarding the magnitude $\Delta t_k$ of the timing skew that exerts an influence between two channels are obtained from the difference between the moving average values of two adjacent channels, as given by equations (eq3a), (eq3b), and (eq3c):

$$MA\{|\Delta x_1[n]|\} - MA\{|\Delta x_2[n]|\} = A(2\Delta t_2 - \Delta t_3 - \Delta t_1) \quad \text{(eq3a)}$$

$$MA\{|\Delta x_2[n]|\} - MA\{|\Delta x_2[n]|\} = A(2\Delta t_3 - \Delta t_2 - \Delta t_4) \quad \text{(eq3b)}$$

$$MA\{|\Delta x_3[n]|\} - MA\{|\Delta x_4[n]|\} = A(2\Delta t_4 - \Delta t_1 - \Delta t_3) \quad \text{(eq3c)}$$

If no timing skew is generated in the TI-ADC circuit 10, the skew amount $\Delta t_k$ of the timing skew on each channel CHk is given by equation (eq4):

$$\Delta t_1 = \Delta t_2 = \Delta t_3 = \Delta t_4 = 0 \quad \text{(eq4)}$$

Thus, when no skew is generated, equations (eq3a), (eq3b), and (eq3c) are rewritten into equations (eq5a), (eq5b), and (eq5c):

$$MA\{|\Delta x_1[n]|\} - MA\{|\Delta x_2[n]|\} = 0 \quad \text{(eq5a)}$$

$$MA\{|\Delta x_2[n]|\} - MA\{|\Delta x_3[n]|\} = 0 \quad \text{(eq5b)}$$

$$MA\{|\Delta x_3[n]|\} - MA\{|\Delta x_4[n]|\} = 0 \quad \text{(eq5c)}$$

In the embodiment, the skew amount $\Delta t_k$ on each channel CHk is so corrected as to satisfy the relations of equations (eq5a), (eq5b), and (eq5c). This can reduce the influence of the skew in the sub-ADCs 101 of the TI-ADC circuit 10.

In the embodiment, the correction amounts $\Delta t_{2cal}$, $\Delta t_{3cal}$, and $\Delta t_{4cal}$ of skews regarding the respective channels CHk are calculated in the following way so that the relations (conditions) of equations (eq5a), (eq5b), and (eq5c) described above are satisfied with respect to equations (eq3a), (eq3b), and (eq3c) regarding the moving average MA.

The sampling clock SCLK1 (and the sampling signal $x_1[n]$) of the sub-ADC 101-1 of the first channel CH1 is regarded as a reference value. The skew amount $\Delta t1$ on the first channel CH1 is therefore 0.

As for the relation "MA{$|\Delta x_1[n]|$} - MA{$|\Delta x_2[n]|$}" of the moving average on the channels CH1 and CH2, the estimation of the skew amount and the correction amount are calculated based on equation (eq6a):

$$A(2(\Delta t_2 - \Delta t_{2cal}) - (\Delta t_3 - \Delta t_{3cal})) = 0 \quad \text{(eq6a)}$$

As for the relation "MA{$|\Delta x_2[n]|$} - MA{$|\Delta x_3[n]|$}" of the moving average on the channels CH2 and CH3, the estimation of the skew amount and the correction amount are calculated based on equation (eq6b):

$$A(2(\Delta t_3 - \Delta t_{3cal}) - (\Delta t_2 - \Delta t_{2cal}) - (\Delta t_4 - \Delta t_{4cal})) = 0 \quad \text{(eq6b)}$$

As for the relation "MA{$|\Delta x_3[n]|$} - MA{$|\Delta x_4[n]|$}" of the moving average on the channels CH3 and CH4, the estimation of the skew amount and the correction amount are calculated based on equation (eq6c):

$$A(2(\Delta t_4 - \Delta t_{4cal}) - (\Delta t_3 - \Delta t_{3cal})) = 0 \quad \text{(eq6c)}$$

The values $\Delta t_{2cal}$, $\Delta t_{3cal}$, and $\Delta t_{4cal}$ are estimated and calculated as correction values of the timing skew so as to satisfy conditional equations (eq6a), and (eq6b), (eq6c).

As described above, the ADC receiving circuit 1 according to the embodiment can reduce the influence of the skew based on calculation processing regarding the moving average between two channels.

Operation Example

An operation example of the ADC receiving circuit 1 according to the embodiment will be described. An operation when the ADC receiving circuit 1 includes the TI-ADC circuit of four channels will be explained with reference to FIG. 10.

As shown in FIG. 10, each of the four sub-ADCs 101 in the TI-ADC circuit 10 samples the input signal SigIN at the sampling timing corresponding to the supplied sampling clock SCLK.

The sub-ADCs 101 sequentially output sampled signals (sampling signals) to the addition circuits 201 via the delay circuits 200. The addition circuit 201-4 receives, from the sub-ADC 101-1, the sampling signal including no delay amount by the delay circuit.

Each addition circuit 201 calculates the difference value of two supplied sampling signals by the subtraction processing.

The addition circuit 201-1 subtracts the sampling signal (delay sampling signal) of the channel CH1 (sub-ADC 101-1) from the sampling signal (delay sampling signal) of the channel CH2 (sub-ADC 101-2).

The addition circuit 201-1 obtains the difference value "$x_2[n]-x_1[n]$" ($=\Delta x_1[n]$).

The addition circuit 201-2 subtracts the sampling signal (delay sampling signal) of the channel CH2 (sub-ADC 101-2) from the sampling signal (delay sampling signal) of the channel CH3 (sub-ADC 101-3).

The addition circuit 201-2 obtains the difference value "$x_3[n]-x_2[n]$" ($=\Delta x_2[n]$).

The addition circuit 201-3 subtracts the sampling signal (delay sampling signal) of the channel CH3 (sub-ADC 101-3) from the sampling signal (delay sampling signal) of the channel CH4 (sub-ADC 101-4).

The addition circuit 201-3 obtains the difference value "$x_4[n]-x_3[n]$" ($=\Delta x_3[n]$).

The addition circuit 201-4 subtracts the sampling signal (delay sampling signal) of the channel CH4 (sub-ADC 101-4) from the sampling signal (delay-free sampling signal) of the channel CH1 (sub-ADC 101-1).

The addition circuit 201-4 obtains the difference value "$x_1[n+1]-x_4[n]$" ($=\Delta x_4[n]$).

Each addition circuit 201 outputs the obtained calculation result to the corresponding one of the addition circuits 203 via the absolute value conversion circuit 202.

Each addition circuit 203 receives the absolute value of the difference value of two sampling signals.

Each addition circuit 203 calculates the difference value of two supplied absolute values by the subtraction processing.

The addition circuit 203-1 subtracts the signal value "$|\Delta x_2[n]|$" based on the calculation result of the addition circuit 201-2 from the signal value "$|\Delta x_1[n]|$" based on the calculation result of the addition circuit 201-1. The addition circuit 203-1 obtains the difference value "$|\Delta x_1[n]|-|\Delta x_2[n]|$".

The addition circuit 203-2 subtracts the signal value "$|\Delta x_3[n]|$" based on the calculation result of the addition circuit 201-3 from the signal value "$|\Delta x_2[n]|$" based on the calculation result of the addition circuit 201-2. The addition circuit 203-1 obtains the difference value "$|\Delta x_2[n]|-|\Delta x_3[n]|$".

The addition circuit 203-3 subtracts a signal value "$|\Delta x_4[n]|$" based on the calculation result of the addition circuit 201-4 from the signal value "$|\Delta x_3[n]|$" based on the calculation result of the addition circuit 201-3. The addition circuit 203-3 obtains the difference value "$|\Delta x_3[n]|-|\Delta x_4[n]|$".

Each addition circuit 203 outputs the calculation result to the corresponding one of the moving average calculation circuits 204.

The results of calculation processes by the addition circuits 201 and 203 are sequentially supplied to each moving average calculation circuit 204 and accumulated in accordance with sampling processing of each sub-ADC 101.

Each moving average calculation circuit 204 calculates moving averages regarding a plurality of supplied signals (signal values).

For example, the first moving average calculation circuit 204-1 calculates moving average values MA$\{|\Delta x_1[n]|\}$ and MA$\{|\Delta x_2[n]|\}$ of $|\Delta x_1[n]|$ and $|\Delta x_2[n]|$ in regard to a plurality of supplied signals "$|\Delta x_1[n]-\Delta x_2[n]|$". Based on the calculation results, the first moving average calculation circuit 204-1 obtains equation (eq3a) described above and the calculation value regarding this equation.

The first moving average calculation circuit 204-1 outputs the value regarding MA$\{|\Delta x_1[n]|\}$-MA$\{|\Delta x_2[n]|\}$ as the calculation result.

For example, the second moving average calculation circuit 204-2 calculates moving average values MA$\{|\Delta x_2[n]|\}$ and MA$\{|\Delta x_3[n]|\}$ of $|\Delta x_2[n]|$ and $|\Delta x_3[n]|$ in regard to a plurality of supplied signals "$|\Delta x_2[n]-\Delta x_3[n]|$". Based on the calculation results, the second moving average calculation circuit 204-2 obtains equation (eq3b) described above and the calculation value regarding this equation.

The second moving average calculation circuit 204-2 outputs the value regarding MA$\{|\Delta x_2[n]|\}$-MA$\{|\Delta x_3[n]|\}$ as the calculation result.

For example, the third moving average calculation circuit 204-3 calculates moving average values MA$\{|\Delta x_3[n]|\}$ and MA$\{|\Delta x_4[n]|\}$ of $|\Delta x_3[n]|$ and $|\Delta x_4[n]|$ in regard to a plurality of supplied signals "$|\Delta x_3[n]-\Delta x_4[n]|$". Based on the calculation results, the third moving average calculation circuit 204-3 obtains equation (eq3c) described above and the calculation value regarding this equation.

The third moving average calculation circuit 204-3 outputs the value regarding MA$\{|\Delta x_3[n]|\}$-MA$\{|\Delta x_4[n]|\}$ as the calculation result.

Multiplication processing of the parameter $\mu_{coarse}$ by each multiplication circuit 205, and feedback processing by each addition circuit 206 and each delay circuit 207 are performed on the output signal of each moving average calculation circuit 204.

The moving average values "MA$\{|\Delta x_k[n]|\}$-MA$\{|\Delta x_{k+1}[n]|\}$" (here, k=1, 2, 3) having undergone various processes are supplied to the first skew correction circuit 122 (and the second skew calibration circuit 13).

The first skew correction circuit 122 performs control for correcting the skew of the sampling clock SCLK based on the supplied moving average values so as to satisfy the conditions of equations (eq6a), (eq6b), and (eq6c) described above.

In the ADC receiving circuit 1 according to the embodiment, the skew of the sampling clock SCLK is reduced.

Effects

The effects of the first skew calibration circuit in the ADC receiving circuit according to the embodiment will be described with reference to FIGS. 11, 12, and 13.

Figure 11:
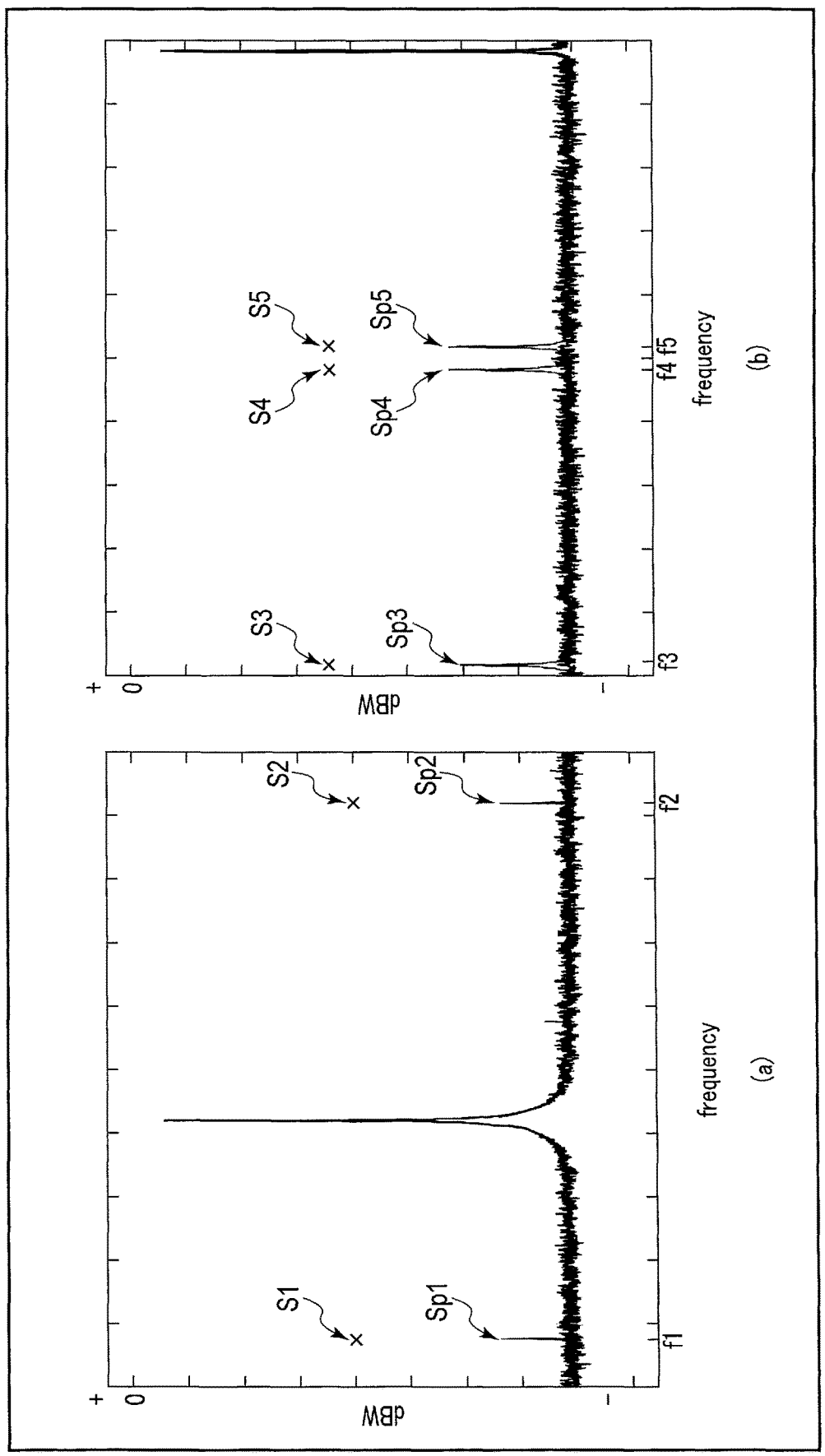
FIGS. 11, 12, and 13 are graphs showing a characteristic of the semiconductor circuit according to the embodiment.

FIG. 11 shows characteristics of the ADC receiving circuit 1 according to the embodiment.

In FIG. 11, (a) shows a frequency characteristic with respect to a low-frequency sine wave in the ADC receiving circuit 1 according to the embodiment. In FIG. 11, (b) shows a frequency characteristic with respect to a high-frequency sine wave in the ADC receiving circuit 1 according to the embodiment.

In (a) and (b) of FIG. 11, an abscissa of a graph corresponds to a frequency, and an ordinate of the graph corresponds to a decibel watt (dBW).

In (a) and (b) of FIG. 11, marks S1, S2, S3, S4, and S5 respectively represent magnitudes (signal values) of spurious components (spur) at corresponding frequencies f1, f2, f3, f4, and f5 in a frequency characteristic of an ADC receiving circuit in a comparative example. In (a) and (b) of FIG. 11, marks Sp1, Sp2, Sp3, Sp4, and Spy respectively represent magnitudes (signal values) of spurious components (spur) at the corresponding frequencies f1, f2, f3, f4, and f5 in a frequency characteristic of the ADC receiving circuit 1 in the embodiment.

Note that the ADC receiving circuit in the comparative example has a circuit configuration not including the first skew calibration circuit 12 in the embodiment.

A spurious component is generated owing to a mismatch of the timing skew. The spurious component degrades an SNDR of the ADC receiving circuit.

As shown in (a) of FIG. 11, the ADC receiving circuit 1 according to the embodiment can obtain an output signal with a small mismatch with respect to the low-frequency input signal.

The ADC receiving circuit 1 according to the embodiment can reduce the spurious components Sp1 and Sp2, compared to the spurious components S1 and S2 in the comparative example.

As shown in (b) of FIG. 11, the ADC receiving circuit 1 according to the embodiment can obtain an output signal with a small mismatch with respect to a relatively high-frequency input signal. As for even reception of the relatively high-frequency input signal, the ADC receiving circuit 1 according to the embodiment can reduce the spurious components Sp3, Sp4, and Spy, compared to the spurious components S3, S4, and S5 in the comparative example.

Figure 12:
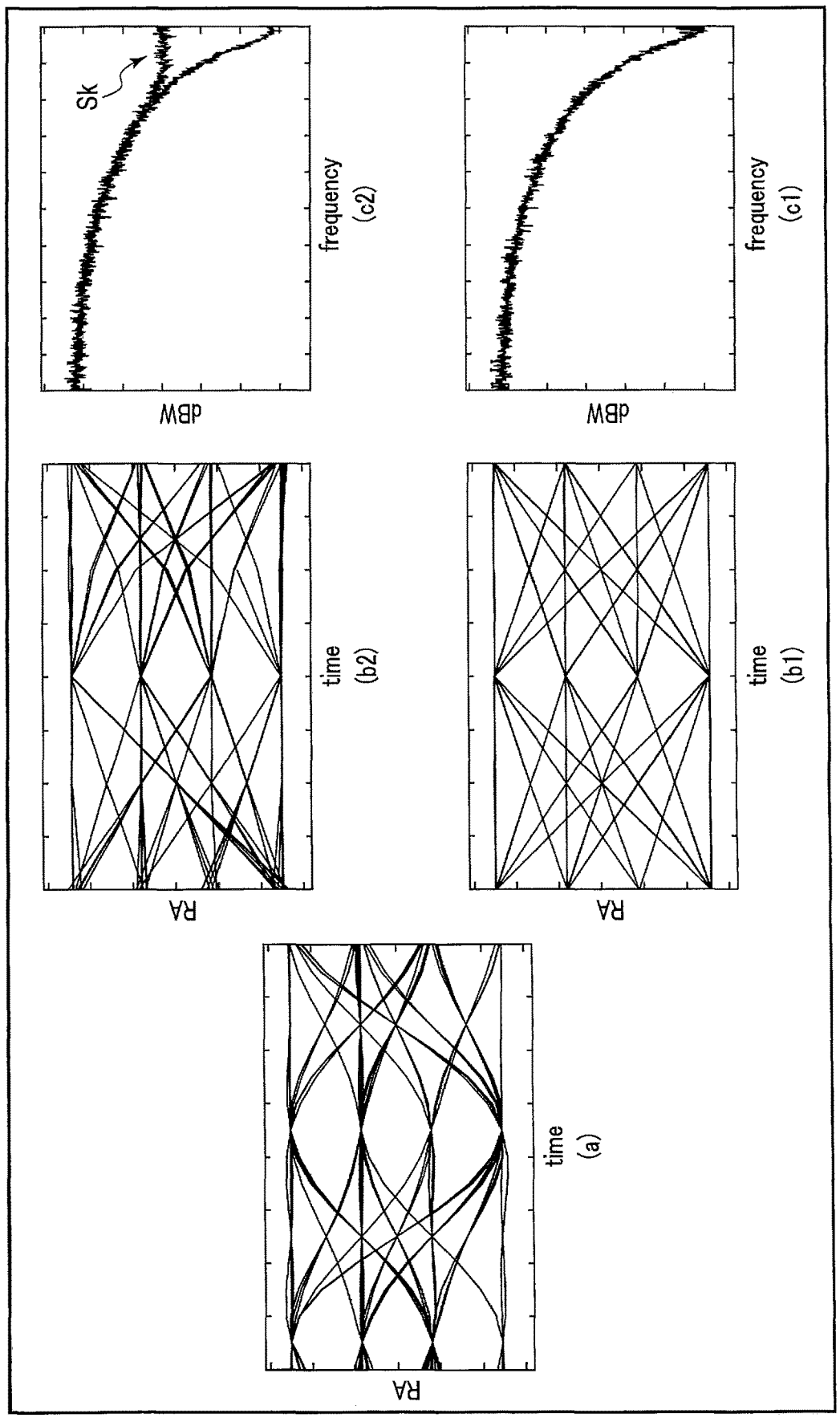

FIG. 12 shows characteristics of the ADC receiving circuit according to the embodiment.

FIG. 12 shows characteristics of the ADC receiving circuit 1 according to the embodiment in regard to a PAM4 (Pulse Amplitude Modulation 4) signal having four signal levels.

In FIG. 12, (a) shows an eye pattern of an input signal. In FIG. 12, (b1) shows an eye pattern of an output signal in the ADC receiving circuit 1 in the embodiment. In FIG. 12, (b2) shows an eye pattern of an output signal in the ADC receiving circuit in the comparative example.

In (a), (b1), and (b2) of FIG. 12, an abscissa of a graph corresponds to a time, and an ordinate of the graph corresponds to an amplitude value (RA).

In FIG. 12, (c1) shows a frequency spectrum of an output signal in the ADC receiving circuit 1 in the embodiment. In FIG. 12, (c2) shows a frequency spectrum of an output signal in the ADC receiving circuit in the comparative example.

In (c1) and (c2) of FIG. 12, an abscissa of a graph corresponds to a frequency, and an ordinate of the graph corresponds to a decibel watt (dBW).

As shown in (b1) of FIG. 12, the ADC receiving circuit 1 according to the embodiment can form the eye pattern with a small distortion in comparison with the comparative example in (b2) of FIG. 12.

As shown in (c2) of FIG. 12, the ADC receiving circuit in the comparative example generates an error Sk arising from the skew in the spectrum pattern.

In contrast, as shown in (ci) of FIG. 12, the ADC receiving circuit 1 in the embodiment can reduce the influence of the skew in the spectrum pattern.

Figure 13:
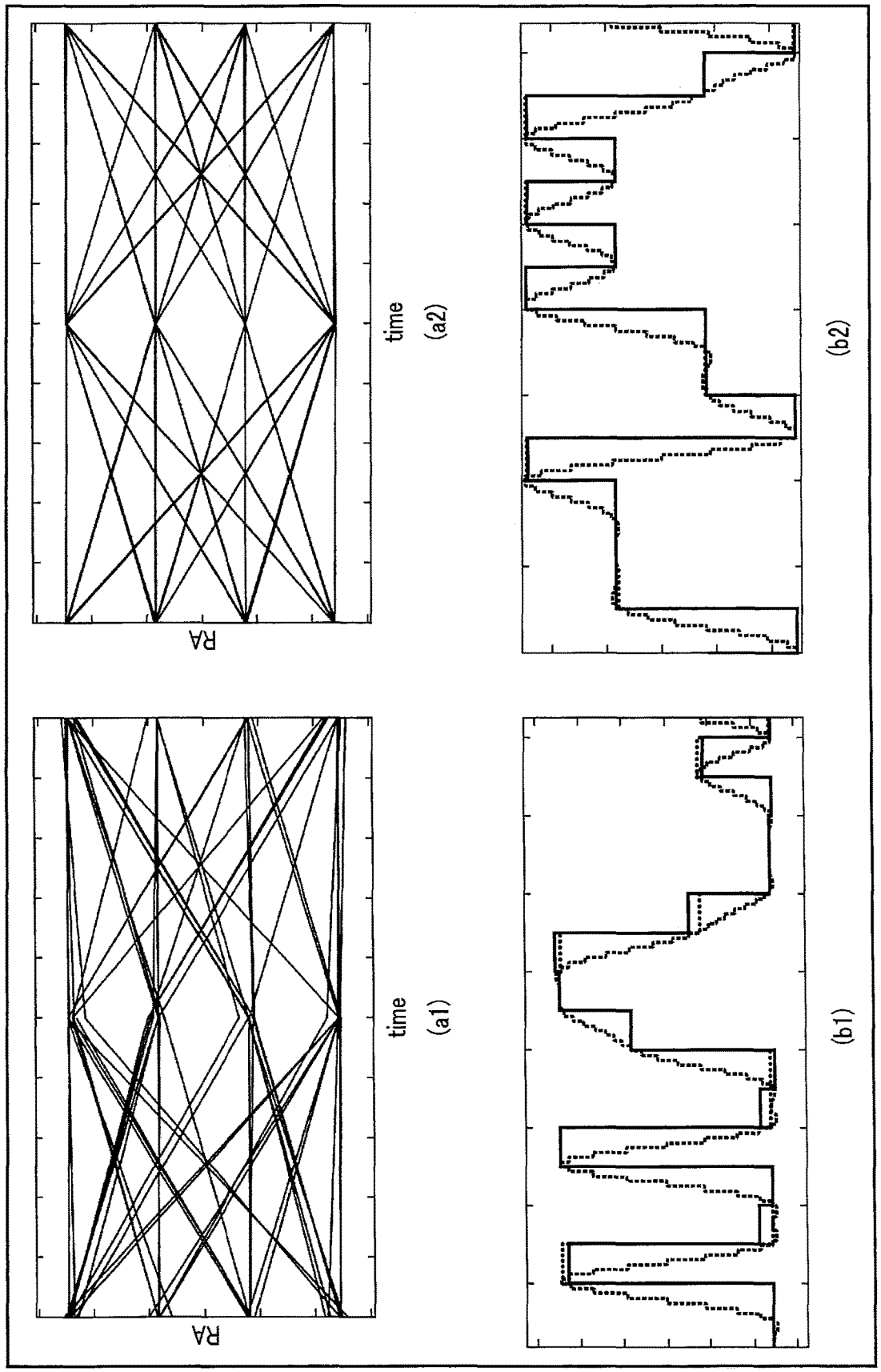

FIG. 13 is a diagram for explaining output characteristics of the ADC receiving circuit according to the embodiment.

In FIG. 13, (al) shows the eye pattern of the ADC receiving circuit in the comparative example. In FIG. 13, (a2) shows the eye pattern of the ADC receiving circuit in the embodiment. In (al) and (a2) of FIG. 13, an abscissa of a graph corresponds to a time, and an ordinate of the graph corresponds to an amplitude value (RA).

In FIG. 13, (b1) shows a waveform pattern of an output signal in the ADC receiving circuit in the comparative example. In FIG. 13, (b2) shows a waveform pattern of an output signal in the ADC receiving circuit in the embodiment. In FIG. 13, (b1) and (b2) show the waveform pattern (pattern of a broken line in FIG. 13) of the input signal, the simulation result (pattern of a dotted line in FIG. 13) of a waveform pattern of the output signal with respect to the input signal, and an actual measurement value (pattern of a solid line in FIG. 13) of the waveform pattern of the output signal in the ADC receiving circuit.

As shown in (a1) of FIG. 13, the eye pattern of the ADC receiving circuit in the comparative example includes a distortion. As shown in (b1) of FIG. 13, the waveform pattern of the output signal in the ADC receiving circuit of the comparative example does not coincide with the simulation result of the waveform pattern of the output signal.

As shown in (a2) of FIG. 13, the ADC receiving circuit in the embodiment can form the eye pattern with a small distortion in comparison with the receiving circuit of the comparative example in (a1) of FIG. 13.

As shown in (b2) of FIG. 13, the waveform pattern of the output signal in the ADC receiving circuit of the embodiment coincides with the simulation result representing a desirable waveform pattern of the output signal with respect to the input signal.

As described above, the ADC receiving circuit according to the embodiment can remove the influence of the skew. As a result, the ADC receiving circuit according to the embodiment can reduce an error in high-speed data transfer.

(c) Second Skew Calibration Circuit

The second skew calibration circuit according to the embodiment will be described with reference to FIGS. 14, 15, 16, 17, 18, and 19.

As will be described below, the second skew calibration circuit 13 can take a plurality of circuit configurations in accordance with respective processing methods used in skew calibration.

In the ADC receiving circuit 1 according to the embodiment, the second skew calibration circuit 13 performs calculation processing regarding an autocorrelation of the input signal and performs calibration processing for reducing the influence of the skew of the sampling clock.

The second skew calibration circuit 13 performs fine calibration processing by digital skew estimation (detection) processing and digital skew correction processing in order to achieve high-precision skew correction.

In the following description, the second skew calibration circuit 13 will also be called the fine skew calibration circuit 13.

Circuit Example 1

An example of the configuration of the second skew calibration circuit of the ADC receiving circuit according to the embodiment will be described with reference to FIGS. 14 and 15.

Figure 14:
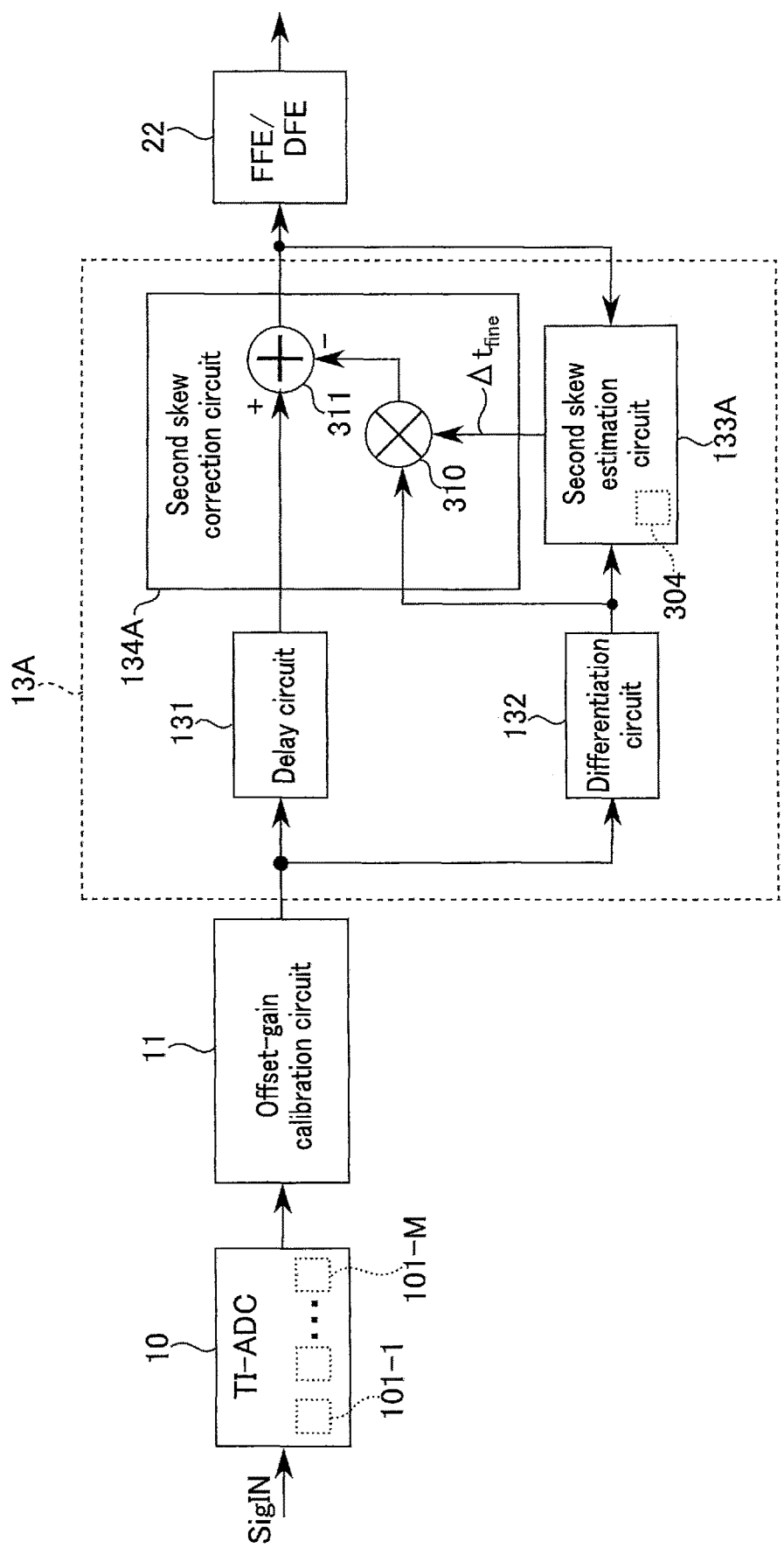

FIG. 14 is a block diagram showing an example of the configuration of a second skew calibration circuit (fine skew calibration circuit) 13A according to the embodiment.

As shown in FIG. 14, the fine skew calibration circuit 13A in circuit example 1 includes one or more delay circuits 131, a differentiation circuit 132, a second skew estimation circuit 133A, and a second skew correction circuit 134A.

The second skew correction circuit 134A includes a multiplication circuit 310 and an addition circuit 311.

The delay circuit 131 is connected to the TI-ADC circuit 10 via the offset-gain calibration circuit 11.

An input node of the delay circuit 131 is connected to a corresponding one of the sub-ADCs 101 via the offset-gain calibration circuit 11. An output node of the delay circuit 131 is connected to an input node of the addition circuit 311 of the second skew correction circuit 134A.

The delay circuit 131 receives the output signal (sampling signal) of the sub-ADC 101 via the offset-gain calibration circuit 11. The output signal from the sub-ADC 101 is a signal having undergone coarse calibration processing of the skew by the above-described coarse skew calibration circuit 12.

The delay circuit 131 applies the delay amount of a given magnitude to the supplied signal. The delay circuit 131 outputs the delay signal of the sampling signal coarsely corrected in regard to the skew.

The differentiation circuit 132 is connected to the TI-ADC circuit 10 via the offset-gain calibration circuit 11.

An input node of the differentiation circuit 132 is connected to the corresponding sub-ADC 101 via the offset-gain calibration circuit 11. An output node of the differentiation circuit 132 is connected to the second skew estimation circuit 133A and the second skew correction circuit 134A. For example, the output node of the differentiation circuit 132 is connected to the multiplication circuit 310 of the second skew correction circuit 134A.

Similar to the delay circuit 131, the differentiation circuit 132 receives the output signal calibrated by the coarse skew calibration circuit 12. The differentiation circuit 132 performs differentiation processing regarding the time on the supplied signal. The differentiation circuit 132 outputs a differential value of the supplied signal.

A first input node of the second skew estimation circuit 133A is connected to the output node of the differentiation circuit 132. A second input node of the second skew estimation circuit 133A is connected to an output node of the addition circuit 311 of the second skew correction circuit 134A. For example, an output node of the second skew estimation circuit 133A is connected to the multiplication circuit 310 of the second skew correction circuit 134A.

The second skew estimation circuit 133A performs detection of the skew and estimation of the skew amount based on the output value of the second skew correction circuit 134A and an output value (the differential value) of the differentiation circuit 132. Based on the estimation result, the second skew estimation circuit 133A calculates a skew amount $\Delta t_{fine}$. The second skew estimation circuit 133A outputs the skew amount $\Delta t_{fine}$ to the second skew correction circuit 134A. The skew amount $\Delta t_{fine}$ is supplied to the multiplication circuit 310 of the second skew correction circuit 134A.

For example, the second skew estimation circuit 133A includes a moving average calculation circuit 304. The skew amount $\Delta t_{fine}$ is calculated based on the moving average of supplied signals (signal values).

In the embodiment, however, the second skew estimation circuit 133A may calculate the skew amount $\Delta t_{fine}$ based on an average value of the supplied signals without performing the moving average calculation processing.

In the second skew correction circuit 134A, the multiplication circuit 310 and the addition circuit 311 have the following connection relationship.

One input node of the multiplication circuit 310 is connected to the output node of the differentiation circuit 132. The other input node of the multiplication circuit 310 is connected to the output node of the second skew estimation circuit 133A. An output node of the multiplication circuit 310 is connected to a negative input node of the addition circuit 311. A positive input node of the addition circuit 311 is connected to the output node of the delay circuit 131.

The multiplication circuit 310 performs multiplication processing on an output signal (differential value) of the differentiation circuit 132 and the skew amount $\Delta t_{fine}$. The multiplication circuit 310 outputs a calculation result to the addition circuit 311.

The addition circuit 311 performs subtraction processing on an output signal of the delay circuit 131 and an output signal of the multiplication circuit 310. The addition circuit 311 outputs a calculation result to the second skew estimation circuit 133A. Also, the addition circuit 311 outputs the calculation result as the output signal of the TI-ADC circuit 10 to a subsequent circuit (for example, the FFE/DFE circuit 22).

The skew calibration circuit 13A in FIG. 14 performs correction amount calculation processing by feedback processing.

The fine skew calibration circuit 13A having the circuit configuration in FIG. 14 can digitally calibrate the skew generated in the sub-ADC by calibration processing on the sampling signal calibrated by the coarse skew calibration circuit 12.

FIG. 15 is a circuit diagram showing an internal configuration of the fine skew calibration circuit 13A in FIG. 14.

FIG. 15 shows the fine skew calibration circuit 13A regarding the two channels CH1 and CH2. In FIG. 15, an illustration of the offset-gain calibration circuit 11 is omitted.

The second skew estimation circuit 133A of the fine skew calibration circuit 13A includes a plurality of processors (calculation circuits) that perform various processes on the sampling signals $x_1[n]$ and $x_2[n]$ of the input signal SigIN.

For example, the second skew estimation circuit 133A includes a plurality of delay circuits ($Z^{-1}$) 300 (300-1 and 300-2) and 308, a plurality of addition circuits (adders) 301 (301-1 and 301-2), 303, and 307, a plurality of absolute value conversion circuits (Abs) 302 (302-1 and 302-2), a plurality of moving average calculation circuits 304 (304-1 and 304-2), a division circuit (divider) 305, and multiplication circuits (multipliers) 306 and 309.

As shown in FIG. 15, an input node of the delay circuit 131-1 is connected to the sub-ADC 101-1 of the first channel CH1 via another circuit (for example, the offset-gain calibration circuit 11). An output node of the delay circuit 131-1 is connected to an input node of the delay circuit 300-1, a positive input node of the addition circuit 301-1, and one input node of the multiplication circuit 309.

The delay circuit 131-1 applies the delay amount of a given magnitude to the supplied signal. The delay circuit 131-1 outputs a delay amount-applied signal to the subsequent circuits 300-1, 301-1, and 309.

An input node of the delay circuit 131-2 is connected to the sub-ADC 101-2 of the second channel CH2 via another circuit (for example, the offset-gain calibration circuit 11). An output node of the delay circuit 131-2 is connected to the positive input node of the addition circuit 311.

The delay circuit 131-2 applies the delay amount of the given magnitude to the supplied signal. The delay circuit 131-2 outputs the delay amount-applied signal to the addition circuit 311.

The input node of the differentiation circuit 132 is connected to the sub-ADC 101-2 of the second channel via another circuit (for example, the offset-gain calibration circuit 11). The output node of the differentiation circuit 132 is connected to one input node of the multiplication circuit 309 and the other input node of the multiplication circuit 310.

The differentiation circuit 132 performs the differentiation processing regarding the time on the supplied signal. The differentiation circuit 132 outputs the calculation result of differentiation processing to the multiplication circuits 309 and 310.

The input node of the delay circuit 300-1 is connected to the output node of the delay circuit 131-1. An output node of the delay circuit 300-1 is connected to a negative input node of the addition circuit 301-2.

The delay circuit 300-1 applies a given delay amount to the supplied sampling signal. The delay circuit 300-1 outputs a delay amount-applied sampling signal (delay sampling signal) to the addition circuit 301-2.

An input node of the delay circuit 300-2 is connected to the output node of the addition circuit 311. An output node of the delay circuit 300-2 is connected to a negative input node of the addition circuit 301-1 and a positive input node of the addition circuit 301-2.

The delay circuit 300-2 applies the given delay amount to the supplied sampling signal. The delay circuit 300-2 outputs the delay amount-applied sampling signal to the addition circuits 301-1 and 301-2.

The positive input node of the addition circuit 301-1 is connected to the output node of the delay circuit 131-1. The negative input node of the addition circuit 301-1 is connected to the output node of the delay circuit 300-2. An output node of the addition circuit 301-1 is connected to the absolute value conversion circuit 302-1.

The addition circuit 301-1 performs subtraction processing on an output signal of the delay circuit 131-1 and an output signal of the delay circuit 300-2. The addition circuit 301-1 outputs a calculation result to the absolute value conversion circuit 302-1.

The positive input node of the addition circuit 301-2 is connected to the output node of the delay circuit 300-2. The negative input node of the addition circuit 301-2 is connected to the output node of the delay circuit 300-1. The output node of the addition circuit 301-2 is connected to the absolute value conversion circuit 302-2.

The addition circuit 301-2 performs subtraction processing on an output signal of the delay circuit 300-1 and the output signal of the delay circuit 300-2. The addition circuit 301-2 outputs a calculation result to the absolute value conversion circuit 302-2.

An input node of the absolute value conversion circuit 302-1 is connected to the addition circuit 301-1. An output node of the absolute value conversion circuit 302-1 is connected to a negative input node of the addition circuit 303.

The absolute value conversion circuit 302-1 converts a supplied value into an absolute value.

An input node of the absolute value conversion circuit 302-2 is connected to the addition circuit 301-2. An output node of the absolute value conversion circuit 302-2 is connected to a positive input node of the addition circuit 303.

The absolute value conversion circuit 302-2 converts the supplied value into an absolute value.

The negative input node of the addition circuit 303 is connected to the absolute value conversion circuit 302-1. The positive input node of the addition circuit 303 is connected to the absolute value conversion circuit 302-2. An output node of the addition circuit 303 is connected to the moving average calculation circuit 304-1.

The addition circuit 303 performs subtraction processing on two signals supplied from the two absolute value conversion circuits 302-1 and 302-2. The addition circuit 303 outputs a calculation result of the subtraction processing to the moving average calculation circuit 304-1.

An input node of the moving average calculation circuit 304-1 is connected to the output node of the addition circuit 303. An output node of the moving average calculation circuit 304-1 is connected to the division circuit 305.

The moving average calculation circuit 304-1 calculates a moving average (moving average value) of supplied signals. The moving average calculation circuit 304-1 outputs a calculation result to the division circuit 305.

An input node of the moving average calculation circuit 304-2 is connected to an output node of the multiplication circuit 309. An output node of the moving average calculation circuit 304-2 is connected to the division circuit 305.

The moving average calculation circuit 304-2 calculates a moving average of supplied signals. The moving average calculation circuit 304-2 outputs a calculation result to the division circuit 305.

Instead of the moving average calculation circuits 304-1 and 304-2, circuits (to be referred to as average value calculation circuits) that calculate the average values of supplied signals (signal values) may be provided between the addition circuit 303 and the division circuit 305 and between the multiplication circuit 309 and the division circuit 305.

One input node of the division circuit 305 is connected to the output node of the moving average calculation circuit 304-1. The other input node of the division circuit 305 is connected to the output node of the moving average calculation circuit 304-2. An output node of the division circuit 305 is connected to the multiplication circuit 306.

The division circuit 305 performs division processing regarding two supplied signal values (moving average values). The division circuit 305 outputs a calculation result of division processing to the multiplication circuit 306.

One input node of the multiplication circuit 306 is connected to the output node of the division circuit 305. An output node of the multiplication circuit 306 is connected to one positive node of the addition circuit 307. A coefficient (for example, weighting factor) $\mu_{fine}$ is supplied to the other input node of the multiplication circuit 306.

The multiplication circuit 306 performs multiplication processing on an output signal of the division circuit 305 and the coefficient $\mu_{fine}$. The multiplication circuit 306 outputs a calculation result to the addition circuit 307.

One positive input node of the addition circuit 307 is connected to the output node of the multiplication circuit 306. The other positive input node of the addition circuit 307 is connected to an output node of the delay circuit 308. An output node of the addition circuit 307 is connected to one input node of the multiplication circuit 310 and an input node of the delay circuit 308.

The addition circuit 307 performs addition processing on an output signal (the calculation result) of the multiplication circuit 306 and an output signal of the delay circuit 308. The addition circuit 307 outputs a calculation result to the multiplication circuit 310 and the delay circuit 308. The calculation result of the addition circuit 307 is fed back to the addition circuit 307 via the delay circuit 308.

The input node of the delay circuit 308 is connected to the output node of the addition circuit 307. The output node of the delay circuit 308 is connected to the other input node of the addition circuit 307.

The delay circuit 308 applies the delay amount of a given magnitude to an output signal (the calculation result) of the addition circuit 307. The delay circuit 308 supplies a delay amount-applied value to the addition circuit 307.

One input node of the multiplication circuit 310 is connected to the output node of the addition circuit 307. The other input node of the multiplication circuit 310 is connected to the output node of the differentiation circuit 132. The output node of the multiplication circuit 310 is connected to the negative input node of the addition circuit 311.

The multiplication circuit 310 performs multiplication processing on an output signal of the differentiation circuit 132 and an output signal of the addition circuit 307. The multiplication circuit 310 outputs calculation result of the multiplication processing to the addition circuit 311. An output signal (the calculation result) of the multiplication circuit 310 is fed back to the addition circuit 311.

For example, the output signal (calculation result) of the addition circuit 311 is supplied as the output signal of the TI-ADC circuit 10 to a subsequent circuit (for example, the above-described FFE/DFE circuit 22).

The fine skew calibration circuit 13A in FIGS. 14 and 15 performs skew calibration processing by a feedback method using the autocorrelation of the input signal.

Circuit Example 2

An example of a configuration of the second skew calibration circuit of the ADC receiving circuit according to the embodiment will be described with reference to FIGS. 16 and 17.

Figure 16:
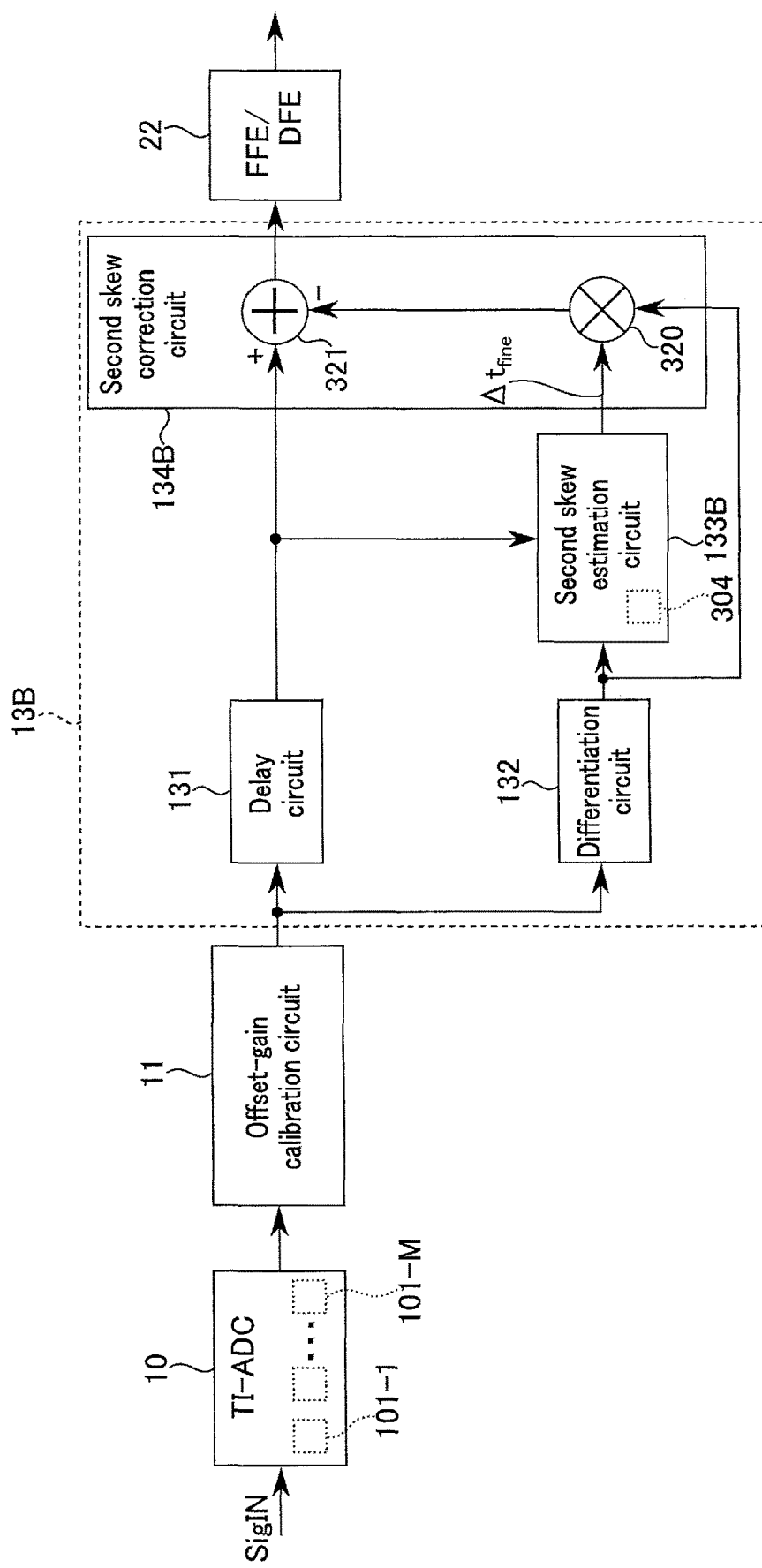

FIG. 16 is a block diagram showing an example of the configuration of a second skew calibration circuit (fine skew calibration circuit) 13B according to the embodiment.

The fine skew calibration circuit 13B in FIG. 16 (and FIG. 17) performs calibration processing regarding the timing skew by a feedforward method.

As shown in FIG. 16, similar to the example in FIGS. 14 and 15, the fine skew calibration circuit 13B in circuit example 2 includes the delay circuit 131, the differentiation circuit 132, a second skew estimation circuit 133B, and a second skew correction circuit 134B.

The connection relationship between the configuration elements 131 to 134B of the feedforward fine skew calibration circuit 13B is different from that between the configuration elements 131 to 134A of the feedback fine skew calibration circuit 13A shown in FIG. 14.

In circuit example 2, similar to the example in FIGS. 14 and 15, the delay circuit 131 and the differentiation circuit 132 receive the sampling signal from the TI-ADC circuit 10 via the offset-gain calibration circuit 11. The sampling signal supplied from the TI-ADC circuit 10 has undergone coarse skew correction processing by the coarse skew calibration circuit 12.

In circuit example 2, the output node of the delay circuit 131 is connected to a positive input node of an addition circuit 321 of the second skew correction circuit 134B and one input node of the second skew estimation circuit 133B.

The output node of the differentiation circuit 132 is connected to the other input node of the second skew estimation circuit 133B and an input node of a multiplication circuit 320 of the second skew correction circuit 134B.

Similar to circuit example 1 in FIGS. 14 and 15, a result (for example, the skew amount $\Delta t_{fine}$) of processing by the second skew estimation circuit 133B is supplied to the multiplication circuit 320.

The addition circuit 321 performs subtraction processing on the output signal (delay signal of the sampling signal) of the delay circuit 131 and an output signal of the multiplication circuit 320. The addition circuit 321 outputs a calculation result to a subsequent circuit (for example, the FFE/DFE circuit 22).

In circuit example 2, the calculation result of the addition circuit 321 is not supplied to the second skew estimation circuit 133B.

In the fine skew calibration circuit 13B of circuit example 2, the second skew estimation circuit 133B performs estimation processing regarding the skew without using a correction amount calculated by the second skew correction circuit 134B.

The fine skew calibration circuit 13B having the circuit configuration in FIG. 16 can digitally calibrate by the feedforward method a skew (for example, a timing skew) generated in the TI-ADC circuit 10.

FIG. 17 is a circuit diagram showing an internal configuration of the fine skew calibration circuit 133 in FIG. 16.

FIG. 17 shows the fine skew calibration circuit 13B regarding the two channels CH1 and CH2. In FIG. 17, an illustration of the offset-gain calibration circuit 11 is omitted.

The second skew estimation circuit 133B of the fine skew calibration circuit 13B includes a plurality of processors (calculation circuits) that perform various processes on the sampling signals $x_1[n]$ and $x_2[n]$ of the input signal SigIN.

For example, the second skew estimation circuit 133B includes the delay circuits ($Z^{-1}$) 300 (300-1 and 300-2), the addition circuits (adders) 301 (301-1 and 301-2), the absolute value conversion circuits (Abs) 302 (302-1 and 302-2), the moving average calculation circuits 304 (304-1 and 304-2), the division circuit (divider) 305, and the multiplication circuit (multiplier) 306.

The configuration of the fine skew calibration circuit 13B in FIG. 17 is different from that of the circuit 13A in FIG. 15 in the following point.

The output node of the delay circuit 131-2 is connected to the input node of the delay circuit 300-2 without passing through another circuit (for example, the addition circuit 311 in FIG. 15).

The delay circuit 131-2 applies a delay amount of a given magnitude to the supplied sampling signal. The delay circuit 131-2 outputs the delay amount-applied signal to the delay circuit 300-2.

In this circuit example, a connection relationship between the multiplication circuit 320 and addition circuit 321 of the second skew correction circuit 134B is different from that between the multiplication circuit 310 and addition circuit 311 of the second skew correction circuit 134A in FIG. 15.

The multiplication circuit 320 of the second skew correction circuit 134B is provided on the subsequent stage of the multiplication circuit 306. In the fine skew calibration circuit 13B, the multiplication circuit 320 is connected to the differentiation circuit 132, the multiplication circuit 306, and the addition circuit 321.

One input node of the multiplication circuit 320 is connected to the output node of the multiplication circuit 306. The other input node of the multiplication circuit 320 is connected to the output node of the differentiation circuit 132. An output node of the multiplication circuit 320 is connected to a negative input node of the addition circuit 321.

The multiplication circuit 320 performs multiplication processing on an output signal of the multiplication circuit 306 and the output signal of the differentiation circuit 132. The multiplication circuit 320 outputs a calculation result to the addition circuit 321.

The addition circuit 321 of the second skew correction circuit 134B is provided on the subsequent stage of the multiplication circuit 320. In the fine skew calibration circuit 13B, the addition circuit 321 is connected to the multiplication circuit 320 and the delay circuit 131-2.

The negative input node of the addition circuit 321 is connected to the output node of the multiplication circuit 320. A positive input node of the addition circuit 321 is connected to the output node of the delay circuit 131-2. An output node of the addition circuit 321 is connected to a subsequent circuit (for example, the FFE/DFE circuit 22).

The addition circuit 321 performs subtraction processing on an output signal of the delay circuit 131-2 and the output signal of the multiplication circuit 320. The addition circuit 321 outputs a result of the subtraction processing to a subsequent circuit (for example, the FFE/DFE circuit 22).

In this manner, the fine skew calibration circuit in FIGS. 16 and 17 performs calibration processing regarding the skew by the feedforward method.

Similar to circuit example 1, an average value calculation circuit may be used in the fine skew calibration circuit 13B instead of the moving average calculation circuit 304.

Concept2

A concept of skew calibration processing by the fine calibration circuit in the ADC receiving circuit according to the embodiment will be described with reference to FIG. 18.

The fine skew calibration circuit 13 (13A or 13B) in FIGS. 14, 15, 16, and 17 performs estimation (detection) and correction of the timing skew using the autocorrelation of the signal subjected to calibration processing.

FIG. 18 is a graph for explaining a concept of estimation and correction of the skew by the fine skew calibration circuit according to the embodiment. In FIG. 18, an abscissa of the graph corresponds to a time, and an ordinate of the graph corresponds to a signal value.

As shown in FIG. 18, as for the two adjacent channels CH1 and CH2, the sub-ADC 101-1 of one channel CH1 samples the signal value $x_1[n]$ at a time $t_1[n]$ in the nth sampling cycle, and the sub-ADC 101-2 of the other channel CH2 samples the signal value $x_2[n]$ at a time $t_2[n]$ after the time $t_1[n]$.

When no timing skew is generated, the change amount of the two signal values $x_1[n]$ and $x_2[n]$ in the sampling period Ts can be represented as "$Ts \times dx_2[n]/dt$".

When the skew is generated on at least one of the two channels CH1 and CH2, the skew amount Δt of a given magnitude is added to the sampling cycle Ts. The change amount of the sampling signal at the skew amount (shift amount in the sampling period) Δt can be represented as "$\Delta t \times dx_2[n]/dt$".

"$Ts \times dx_2[n]/dt$" is equivalent to an ideal difference amount of two sampling signals on two channels of the TI-ADC circuit 10.

"$\Delta t \times dx_2[n]/dt$" is equivalent to a value (to be referred to as a sampling error value or an error value) of a sampling error arising from the timing skew.

In the embodiment, the fine skew calibration circuit 13 removes the value of the sampling error from the sampling signal.

The fine skew calibration circuit 13 calculates a parameter regarding the autocorrelation of the signal in order to calculate the error value.

In the following description, the parameter (or function) representing the autocorrelation will be referred to as "R".

For example, the relationship between the autocorrelation "R" regarding the two sampling signals $x_1[n]$ and $x_2[n]$ and the skew amount Δt is given by equation (eq10):

$$E[(x_2[n]-x_1[n])^2]-E[(x_1[n+1]-x_2[n])^2]=-4\times\Delta t\times dR/dt \quad (eq10)$$

In equation (eq10), "E" means that the equation (or function or numerical value) is related to the expected value (or average value).

In the ADC receiving circuit 1 according to the embodiment, the fine skew calibration circuit 13 reduces the influence of the timing skew generated in the sampling clock by removing the sampling error arising from the skew from the sampling signal based on the calculation result of the autocorrelation of the signal.

Operation Example and Calculation Processing

An operation example of the fine skew calibration circuit 13 and calculation processing executed by the fine skew calibration circuit 13 in the ADC receiving circuit 1 according to the embodiment will be described with reference to FIGS. 14, 15, 16, and 17.

An operation and calculation processing for calibration processing of the timing skew regarding the channels CH1 and CH2 of a plurality of channels of the TI-ADC circuit 10 will be explained.

Operation Example 1

An operation example and calculation processing of the fine skew calibration circuit 13A in FIGS. 14 and 15 according to the embodiment will be described.

In the nth sampling cycle, the sampling signal $x_1[n]$ of the channel CH1 and the sampling signal $x_2[n]$ of the channel CH2 are sampled by the corresponding sub-ADCs 101-1 and 101-2, respectively.

Various processes such as delay processing, differentiation processing, and absolute value conversion are performed on the sampling signals $x_1[n]$ and $x_2[n]$.

For example, the addition circuit 301-1 performs subtraction processing on the output signal of the delay circuit 131-1 and the output signal of the delay circuit 300-2. The addition circuit 301-2 performs subtraction processing on the output signal of the delay circuit 300-1 and the output signal of the delay circuit 300-2.

Each absolute value conversion circuit 302 converts the value of the output signal of the corresponding addition circuit 301 into an absolute value.

For example, the differentiation circuit 132 performs the differentiation processing on the sampling signal $x_2[n]$. The differentiation circuit 132 outputs a calculation result ($dx_2[n]/dt$) to the multiplication circuit 309. The multiplication circuit 309 performs multiplication processing on the output signal of the differentiation circuit 132 and the delay signal of the sampling signal $x_1[n]$.

The addition circuit 303 performs the subtraction processing on two signals based on the sampling signals $x_1[n]$ and $x_2[n]$. As a result, a difference amount "$x_2[n]-x_1[n]$" between the two sampling signals $x_1[n]$ and $x_2[n]$ is obtained.

The moving average calculation circuit 304-1 receives the difference amount "$x_2[n]-x_1[n]$" between the sampling signals of the channels CH1 and CH2.

The moving average calculation circuit 304-1 obtains the autocorrelation regarding the two channels CH1 and CH2 by moving average calculation processing on supplied signals.

For example, the calculation result of the moving average calculation circuit 304-1 has a value proportional to a value "$\Delta t_{fine} \times dR/dt$" of the autocorrelation including the skew amount $\Delta t_{fine}$ as a coefficient (for example, slope).

The moving average calculation circuit 304-2 obtains a differential value "dR/dt" of the autocorrelation by moving average calculation processing on the supplied output signal of the multiplication circuit 309.

The division circuit 305 performs the division processing on the output signal (value having a proportional relationship with $\Delta t_{fine} \times dR/dt$) of the moving average calculation circuit 304-1 and the output signal (dR/dt) of the moving average calculation circuit 304-2.

Accordingly, a parameter (numerical value) including the skew amount $\Delta t_{fine}$ is obtained.

After that, the multiplication processing by the multiplication circuit 306 and the addition processing by the addition circuit 307 are performed on the output signal of the division circuit 305, obtaining the skew amount $\Delta t_{fine}$.

The multiplication circuit 310 receives the output signal of the differentiation circuit 132 together with the output signal of the addition circuit 307. The multiplication circuit 310 performs the multiplication processing on the skew amount $\Delta t_{fine}$ and the output signal of the differentiation circuit 132. Here, the output signal of the differentiation circuit 132 is the differential value "$dx_2[n]/dt$" of the sampling signal $x_2[n]$ of the channel CH2.

The calculation result of the multiplication circuit 310 is therefore the value "$\Delta t_{fine} \times dx_2[n]/dt$" of the sampling error caused by the timing skew between the two channels CH1 and CH2. The calculated sampling error value is supplied to the addition circuit 311 provided on the transmission path of the channel CH2.

The addition circuit 311 subtracts, by the subtraction processing, the sampling error value "$\Delta t_{fine} \times dx_2[n]/dt$" from a sampling signal $x_2[n]$ supplied from the sub-ADC 101-2 of the channel CH2 in a sampling period subsequent to the sampling period of the sampling signal used in calculation processing.

The addition circuit 311 outputs to the subsequent circuit the sampling signal from which the influence of the skew has been removed.

In this manner, the feedback fine skew calibration circuit 13A removes the influence of the timing skew on the sampling signal.

Operation Example 2

An operation example and calculation processing of the fine skew calibration circuit 13B in FIGS. 16 and 17 according to the embodiment will be described.

In the fine skew calibration circuit in FIGS. 16 and 17, similar to the operation and calculation processing in operation example 1, the addition circuit 303 calculates the difference amount "$x_2[n]-x_1[n]$" between the signals (signal values) on the two channels CH1 and CH2 using the absolute values of the output signals of the addition circuits 301-1 and 301-2.

Similar to operation example 1, the moving average calculation circuit 304-1 obtains the output signal "$\Delta t_{fine} \times dR/dt$" regarding the autocorrelation as the calculation result of the moving average value with respect to "$x_2[n]-x_1[n]$".

Similar to example 1, the moving average calculation circuit 304-2 obtains the differential value (dR/dt) of the autocorrelation as the calculation result.

Similar to operation example 1, the division circuit 305 performs division processing on the output signals of the two moving average calculation circuits 304-1 and 304-2. The multiplication circuit 306 multiplies the output signal of the division circuit 305 by the parameter $\mu_{fine}$.

As a result, the skew amount $\Delta t_{fine}$ generated between the two channels CH1 and CH2 is obtained.

The multiplication circuit 320 receives the output signal of the differentiation circuit 132 together with the output signal of the multiplication circuit 306. The multiplication circuit 320 multiplies the output signal of the differentiation circuit 132 by the skew amount $\Delta t_{fine}$. Hence, the calculation result of the multiplication circuit 320 becomes "$\Delta t_{fine} \times dx_2[n]/dt$".

In this fashion, the sampling error value "$\Delta t_{fine} \, dx_2[n]/dt$" arising from the mismatch of the timing skew between the two channels CH1 and CH2 is calculated.

The addition circuit 321 subtracts "$\Delta t_{fine} \times dx_2[n]/dt$" from the supplied sampling signal $x_2[n]$ of the channel CH2.

The addition circuit 321 outputs to a subsequent circuit the sampling signal from which the influence of the skew has been removed.

Note that substantially the same operation and calculation processing as those in operation example 1 and operation example 2 are executed on the sampling signals of the channels CH2 and CH3, the sampling signals of the channels CH3 and CH4, and the sampling signals of the channels CH4 and CH1.

The ADC receiving circuit 1 can transfer to a subsequent circuit the output signal from which the influence of the skew has been removed.

Effects

The effects of the second skew calibration circuit in the ADC receiving circuit according to the embodiment will be described with reference to FIG. 19.

Figure 19:
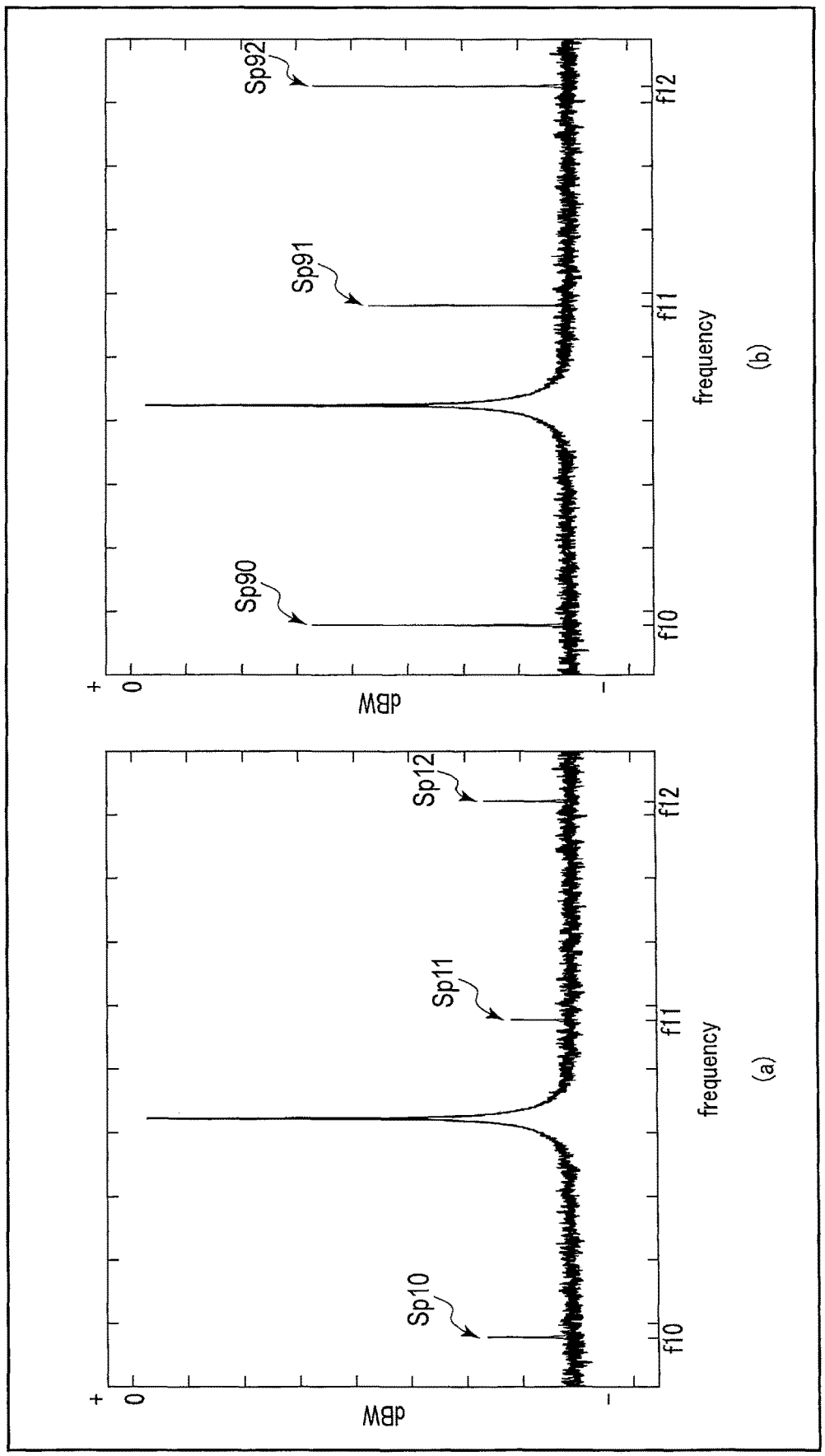
FIG. 19 is a diagram showing the characteristics of the semiconductor circuit according to the embodiment.

FIG. 19 is a view for explaining the effects of the fine skew calibration circuit in the ADC receiving circuit according to the embodiment.

In FIG. 19, (a) shows a frequency characteristic of the ADC receiving circuit 1 including the fine skew calibration circuit 13 in the embodiment. In FIG. 19, (b) shows a frequency characteristic of an ADC receiving circuit in a comparative example. Note that the ADC receiving circuit in the comparative example has a circuit configuration including neither the first skew calibration circuit 12 nor the second skew calibration circuit 13 in the embodiment. In (a) of FIG. 19, the ADC receiving circuit 1 in the embodiment includes the above-described coarse skew calibration circuit 12 in addition to the fine skew calibration circuit 13.

In (a) and (b) of FIG. 19, an abscissa of a graph corresponds to the frequency, and an ordinate of the graph corresponds to the decibel watt.

In (a) and (b) of FIG. 19, spurious components Sp10, Sp11, Sp12, Sp90, Sp91, and Sp92 are generated at given frequencies f10, f11, and f12.

As shown in (a) of FIG. 19, the ADC receiving circuit 1 in the embodiment can reduce the spurious components Sp10, Sp11, and Sp12, compared to the spurious components Sp90, Sp91, and Sp92 in the comparative example of (b) of FIG. 19.

In the ADC receiving circuit 1 according to the embodiment, the fine skew calibration circuit 13 can suppress the influence of the skew by the estimation and the correction of the skew amount by the digital processing.

By removing the sampling error value by the digital processing, the fine skew calibration circuit 13 can further reduce the influence of the skew in comparison with skew correction by analog processing.

By the calibration based on the digital processing, the ADC receiving circuit 1 according to the embodiment can suppress the degradation of the characteristics of the receiving circuit caused by the timing skew.

(d) Summary

To implement high-speed data transfer, the receiving circuit using the TI-ADC circuit is used in a system and/or device such as a memory system.

In the TI-ADC circuit, a mismatch of sampling arising from the timing skew may be generated.

Since the mismatch of sampling depends on an input signal, calibration regarding the timing skew is relatively difficult.

In the embodiment, the ADC receiving circuit (semiconductor circuit) 1 including the TI-ADC circuit 10 corrects the skew of the sampling clock supplied to the TI-ADC circuit 10 based on the calculation result of the moving average of sampling signals of two channels whose sampling timings regarding one input signal to be sampled are temporarily adjacent to each other.

In the embodiment, the ADC receiving circuit 1 including the TI-ADC circuit 10 removes the error value included in the sampling signal based on the autocorrelation regarding one input signal to be sampled.

The ADC receiving circuit 1 according to the embodiment can reduce the influence of the timing skew in the sampling processing of the input signal.

The ADC receiving circuit 1 according to the embodiment removes the timing skew at two stages using two calibration circuits.

Of the two calibration circuits, one skew calibration circuit (coarse skew calibration circuit 12) performs calibration processing regarding the skew based on the calculation result of the moving average by the analog signal processing.

One skew calibration circuit coarsely calibrates (and corrects) the influence of the timing skew (for example, a phase shift between sampling clocks).

Of the two calibration circuits, the other skew calibration circuit (fine skew calibration circuit 13) performs calculation processing by the digital signal processing based on the calculation result regarding the autocorrelation of the signal from the TI-ADC circuit 10.

The other skew calibration circuit finely calibrates (and corrects) the influence of the timing skew (for example, the sampling error value in the sampling signal).

The ADC receiving circuit 1 according to the embodiment can implement high-speed data transfer by compensation of the timing skew using two different methods and configurations while hardly decreasing the data transfer speed in the system (or device) including the ADC receiving circuit 1.

In the above-described embodiment, the ADC receiving circuit 1 includes both the coarse skew calibration circuit 12 and the fine skew calibration circuit 13. However, the ADC receiving circuit 1 according to the embodiment suffices to include either the coarse skew calibration circuit 12 or the fine skew calibration circuit 13. Even when the ADC receiving circuit 1 according to the embodiment includes only the coarse skew calibration circuit 12 or only the fine skew calibration circuit 13, the ADC receiving circuit 1 according to the embodiment can obtain the above-described effects.

In this way, the semiconductor circuit according to the embodiment can suppress degradation of the operation characteristics.

(e) Others

The ADC receiving circuit 1 serving as the semiconductor circuit according to the embodiment may be used in the receiving circuit RXsv of the server 900 and/or the receiving circuit RXhst of the host device 700.

In the above-described embodiment, the device (system) including the skew calibration circuits 12 and 13 is exemplified as a memory system. However, the semiconductor circuit according to the above-described embodiment may be applied to a system and/or device such as a wireless communication system, other than the memory system.

For example, the semiconductor circuit according to the embodiment may be mounted in a smartphone, a feature phone, a router, a base station, a personal computer, a game device, an in-vehicle terminal, and a home appliance.

A circuit including at least either the skew calibration circuit 12 or 13 according to the embodiment may be applied to a device other than the receiving circuit.

In the memory system including the semiconductor circuit according to the embodiment, a memory device in the memory system may be a flash memory (for example, NOR flash memory) other than a NAND flash memory, or a random access memory. For example, the random access memory is selected from a DRAM, SRAM, ReRAM, MRAM, PCRAM, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor circuit comprising:
    an analog-to-digital conversion circuit including a first analog-to-digital converter configured to sample at least one first sampling signal regarding an input signal based on a first clock, and a second analog-to-digital converter configured to sample at least one second sampling signal regarding the input signal based on a second clock shifted from the first clock by a first time; and
    a first calibration circuit configured to calibrate at least one timing of the first clock and the second clock based on a calculation result of a moving average of the first sampling signal and the second sampling signal.

2. The semiconductor circuit according to claim 1, wherein the first calibration circuit includes:
    a first calculation circuit configured to calculate a difference value between the first sampling signal and the second sampling signal in each of a plurality of sampling cycles by the analog-to-digital conversion circuit;
    a second calculation circuit configured to calculate a value of the moving average of the first sampling signal and the second sampling signal based on the difference value; and
    a correction circuit configured to calibrate at least one timing of the first clock and the second clock based on the value of the moving average.

3. The semiconductor circuit according to claim 1, further comprising:
    a second calibration circuit configured to calibrate a sampling error included in at least one of the first sampling signal and the second sampling signal based on calculation processing regarding an autocorrelation of the first sampling signal and the second sampling signal.

4. The semiconductor circuit according to claim 3, wherein the second calibration circuit includes:
- a third calculation circuit configured to calculate a first value corresponding to a product of a skew amount included in the first sampling signal and the second sampling signal and the autocorrelation of the first sampling signal and the second sampling signal;
- a fourth calculation circuit configured to calculate a second value regarding a differential value of the autocorrelation;
- a fifth calculation circuit configured to calculate the skew amount based on the first value and the second value; and
- a sixth calculation circuit configured to calculate the sampling error included in the second sampling signal based on the skew amount and the second sampling signal.

5. The semiconductor circuit according to claim 3, wherein the first sampling signal and the second sampling signal supplied to the second calibration circuit include a result of calibration by the first calibration circuit.

6. A receiving device comprising:
- the semiconductor circuit according to claim 1; and
- a first circuit configured to process a sampling signal obtained based on the first clock and the second clock calibrated by the semiconductor circuit.

7. The receiving device according to claim 6, wherein the first calibration circuit of the semiconductor circuit includes:
- a first calculation circuit configured to calculate a difference value between the first sampling signal and the second sampling signal in each of a plurality of sampling cycles by the analog-to-digital conversion circuit;
- a second calculation circuit configured to calculate a value of the moving average of the first sampling signal and the second sampling signal based on the difference value; and
- a correction circuit configured to calibrate at least one timing of the first clock and the second clock based on the value of the moving average.

8. The receiving device according to claim 6, wherein the semiconductor circuit further comprises:
- a second calibration circuit configured to calibrate a sampling error included in at least one of the first sampling signal and the second sampling signal based on calculation processing regarding an autocorrelation of the first sampling signal and the second sampling signal.

9. The receiving device according to claim 8, wherein the second calibration circuit includes:
- a third calculation circuit configured to calculate a first value corresponding to a product of a skew amount included in the first sampling signal and the second sampling signal and the autocorrelation of the first sampling signal and the second sampling signal;
- a fourth calculation circuit configured to calculate a second value regarding a differential value of the autocorrelation;
- a fifth calculation circuit configured to calculate the skew amount based on the first value and the second value; and
- a sixth calculation circuit configured to calculate the sampling error included in the second sampling signal based on the skew amount and the second sampling signal.

10. The receiving device according to claim 8, wherein the first sampling signal and the second sampling signal supplied to the second calibration circuit include a result of calibration by the first calibration circuit.

11. A memory system comprising:
- the receiving device according to claim 6;
- a control circuit configured to control processing of a signal output from the receiving device; and
- a memory device configured to store data corresponding to the signal processed under the control of the control circuit.

12. The memory system according to claim 11, wherein the first calibration circuit of the semiconductor includes:
- a first calculation circuit configured to calculate a difference value between the first sampling signal and the second sampling signal in each of a plurality of sampling cycles by the analog-to-digital conversion circuit;
- a second calculation circuit configured to calculate a value of the moving average of the first sampling signal and the second sampling signal based on the difference value; and
- a correction circuit configured to calibrate at least one timing of the first clock and the second clock based on the value of the moving average.

13. The memory system according to claim 11, wherein the semiconductor circuit further comprises:
- a second calibration circuit configured to calibrate a sampling error included in at least one of the first sampling signal and the second sampling signal based on calculation processing regarding an autocorrelation of the first sampling signal and the second sampling signal.

14. The memory system according to claim 13, wherein the second calibration circuit includes:
- a third calculation circuit configured to calculate a first value corresponding to a product of a skew amount included in the first sampling signal and the second sampling signal and the autocorrelation of the first sampling signal and the second sampling signal;
- a fourth calculation circuit configured to calculate a second value regarding a differential value of the autocorrelation;
- a fifth calculation circuit configured to calculate the skew amount based on the first value and the second value; and
- a sixth calculation circuit configured to calculate the sampling error included in the second sampling signal based on the skew amount and the second sampling signal.

15. A semiconductor circuit comprising:
- an analog-to-digital conversion circuit including a first analog-to-digital converter configured to sample at least one first sampling signal regarding an input signal based on a first clock, and a second analog-to-digital converter configured to sample at least one second sampling signal regarding the input signal based on a second clock shifted from the first clock by a first time; and
- a first calibration circuit configured to calibrate a sampling error included in at least one of the first sampling signal and the second sampling signal based on calculation processing regarding an autocorrelation of the first sampling signal and the second sampling signal.

16. The semiconductor circuit according to claim 15, wherein the first calibration circuit includes:
- a first calculation circuit configured to calculate a first value corresponding to a product of a skew amount included in the first sampling signal and the second sampling signal and the autocorrelation of the first sampling signal and the second sampling signal;
a second calculation circuit configured to calculate a second value regarding a differential value of the autocorrelation;
a third calculation circuit configured to calculate the skew amount based on the first value and the second value; and
a fourth calculation circuit configured to calculate the sampling error included in the second sampling signal based on the skew amount and the second sampling signal.

17. A receiving device comprising:
the semiconductor circuit according to claim 15; and
a first circuit configured to process a sampling signal obtained based on the first clock and the second clock calibrated by the semiconductor circuit.

18. The receiving device according to claim 17, wherein the first calibration circuit of the semiconductor circuit includes:
a first calculation circuit configured to calculate a first value corresponding to a product of a skew amount included in the first sampling signal and the second sampling signal and the autocorrelation of the first sampling signal and the second sampling signal;
a second calculation circuit configured to calculate a second value regarding a differential value of the autocorrelation;
a third calculation circuit configured to calculate the skew amount based on the first value and the second value; and
a fourth calculation circuit configured to calculate the sampling error included in the second sampling signal based on the skew amount and the second sampling signal.

19. A memory system comprising:
the receiving device according to claim 17;
a control circuit configured to control processing of a signal output from the receiving device; and
a memory device configured to store data corresponding to the signal processed under the control of the control circuit.

20. The memory system according to claim 19, wherein the first calibration circuit of the semiconductor circuit includes:
a first calculation circuit configured to calculate a first value corresponding to a product of a skew amount included in the first sampling signal and the second sampling signal and the autocorrelation of the first sampling signal and the second sampling signal;
a second calculation circuit configured to calculate a second value regarding a differential value of the autocorrelation;
a third calculation circuit configured to calculate the skew amount based on the first value and the second value; and
a fourth calculation circuit configured to calculate the sampling error included in the second sampling signal based on the skew amount and the second sampling signal.

* * * * *